(12) United States Patent
Katayama

(10) Patent No.: US 7,768,087 B2
(45) Date of Patent: Aug. 3, 2010

(54) PHOTODIODE, SOLID SLATE IMAGE SENSOR, AND METHOD OF MANUFACTURING THE SAME

(75) Inventor: Masaya Katayama, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 10 days.

(21) Appl. No.: 12/037,438

(22) Filed: Feb. 26, 2008

(65) Prior Publication Data

US 2009/0001496 A1 Jan. 1, 2009

Related U.S. Application Data

(63) Continuation of application No. PCT/JP2005/015838, filed on Aug. 31, 2005.

(51) Int. Cl.
*H01L 31/0216* (2006.01)

(52) U.S. Cl. .................. 257/435; 257/291; 257/292; 257/E31.054; 257/E31.122

(58) Field of Classification Search ............. 257/435, 257/291–292; 438/98
See application file for complete search history.

(56) References Cited

U.S. PATENT DOCUMENTS

| | | | |
|---|---|---|---|
| 5,859,450 A | 1/1999 | Clark et al. | |
| 6,504,194 B1 | 1/2003 | Miida | |
| 6,545,331 B1 | 4/2003 | Miida | |
| 6,590,242 B1 | 7/2003 | Kozuka et al. | |
| 6,608,299 B2 | 8/2003 | Kozuka | |
| 6,656,777 B2 | 12/2003 | Miida | |
| 6,677,627 B2 | 1/2004 | Miida | |
| 2002/0063199 A1 | 5/2002 | Kozuka | |
| 2003/0057431 A1 | 3/2003 | Kozuka et al. | |
| 2003/0064539 A1 | 4/2003 | Miida | |
| 2004/0046194 A1 | 3/2004 | Kozuka et al. | |

(Continued)

FOREIGN PATENT DOCUMENTS

JP   2000-312024 A   11/2000

(Continued)

OTHER PUBLICATIONS

Office Action dated Aug. 24, 2009 in the corresponding Korean patent application No. 10-2008-7004864.

(Continued)

*Primary Examiner*—Davienne Monbleau
*Assistant Examiner*—A. Sefer
(74) *Attorney, Agent, or Firm*—Westerman, Hattori, Daniels & Adrian, LLP

(57) ABSTRACT

A photodiode formed over a silicon substrate is disclosed. The photodiode includes a light-receiving region formed of a diffusion region of a first conduction type at the surface of the silicon substrate and forming a pn junction; an intermediate region formed of a diffusion region of the first conduction type at the surface of the silicon substrate so as to be included in the light-receiving region; a contact region formed of a diffusion region of the first conduction type at the surface of the silicon substrate so as to be included in the intermediate region; a shield layer formed of a diffusion region of a second conduction type in a part of the surface of the silicon substrate outside the intermediate region; and an electrode in contact with the contact region. The shield layer faces the side end part of the diffusion region forming the intermediate region.

9 Claims, 29 Drawing Sheets

U.S. PATENT DOCUMENTS

2005/0205905 A1 * 9/2005 Rhodes .................. 257/292

FOREIGN PATENT DOCUMENTS

| | | |
|---|---|---|
| JP | 2002-50753 A | 2/2002 |
| JP | 2002-164566 A | 6/2002 |
| JP | 2002-237614 A | 8/2002 |
| JP | 2004-312039 A | 11/2004 |
| KR | 2001-30818 A | 4/2001 |
| KR | 2001-62028 A | 7/2001 |

OTHER PUBLICATIONS

International Search Report of PCT/JP2005/015838, date of mailing Nov. 15, 2005.

* cited by examiner

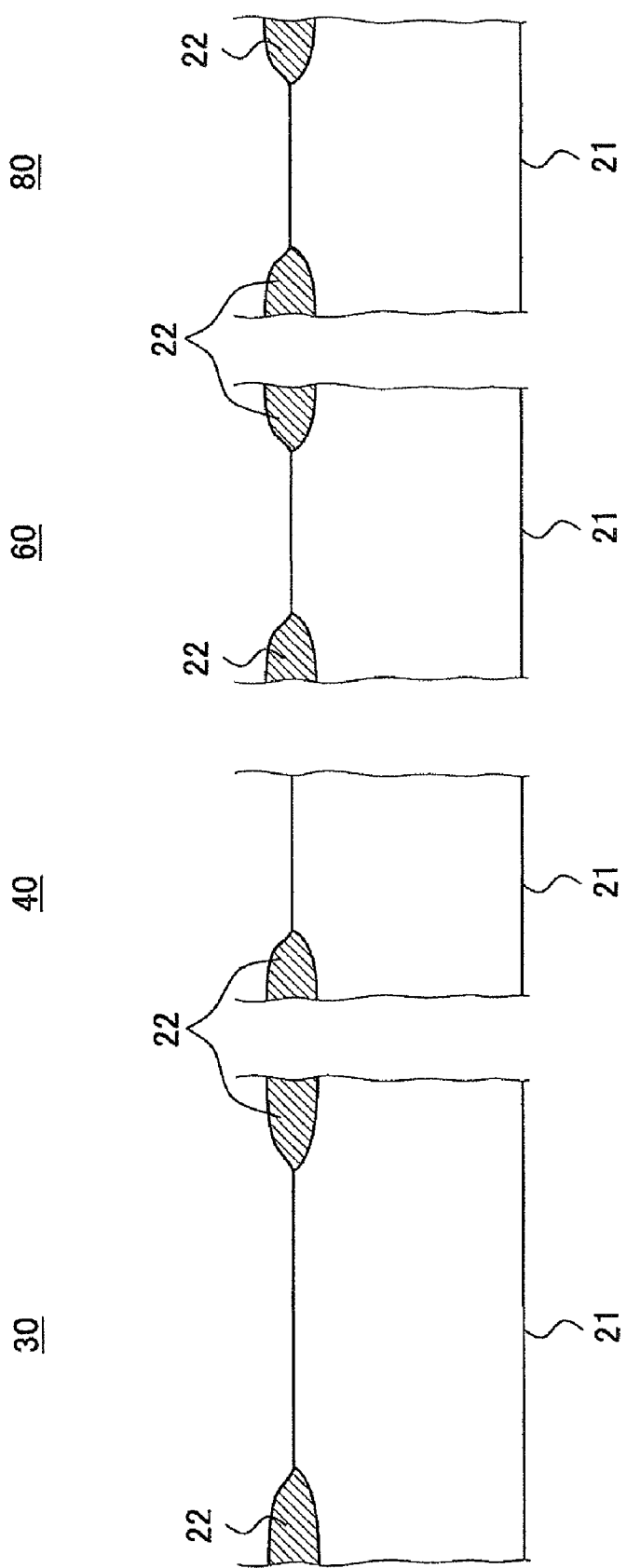

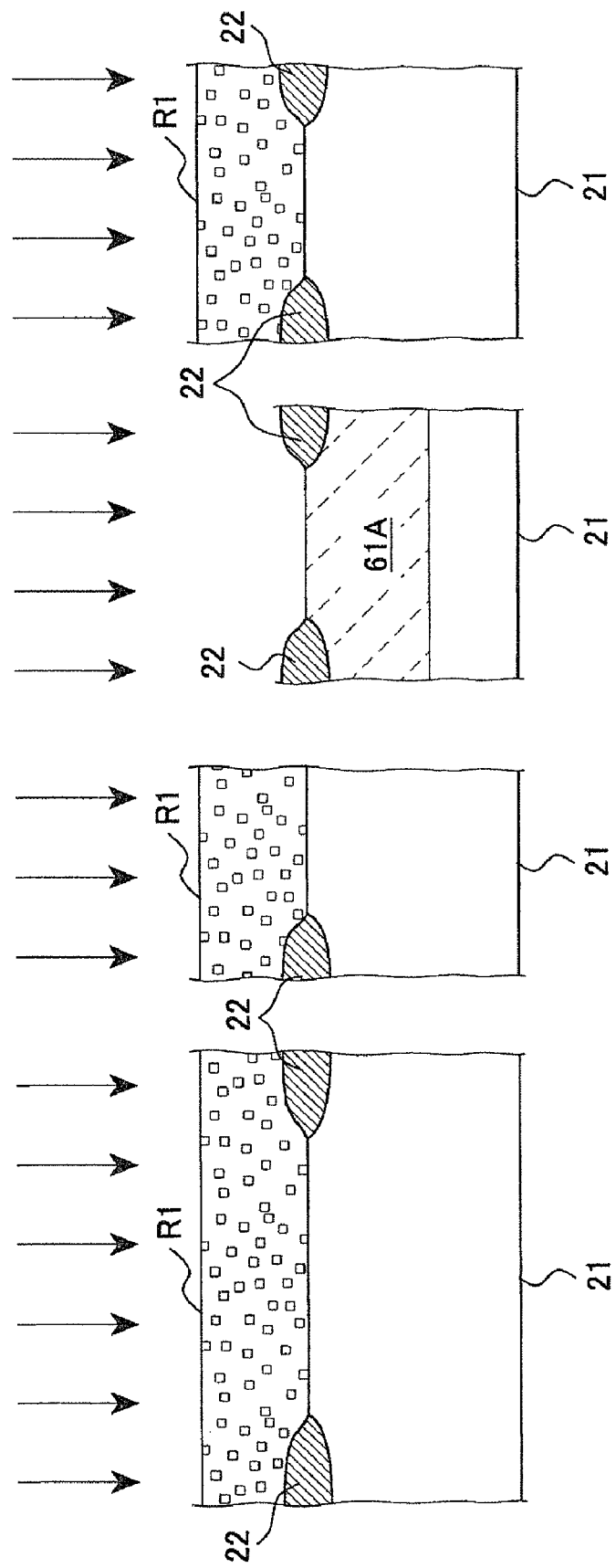

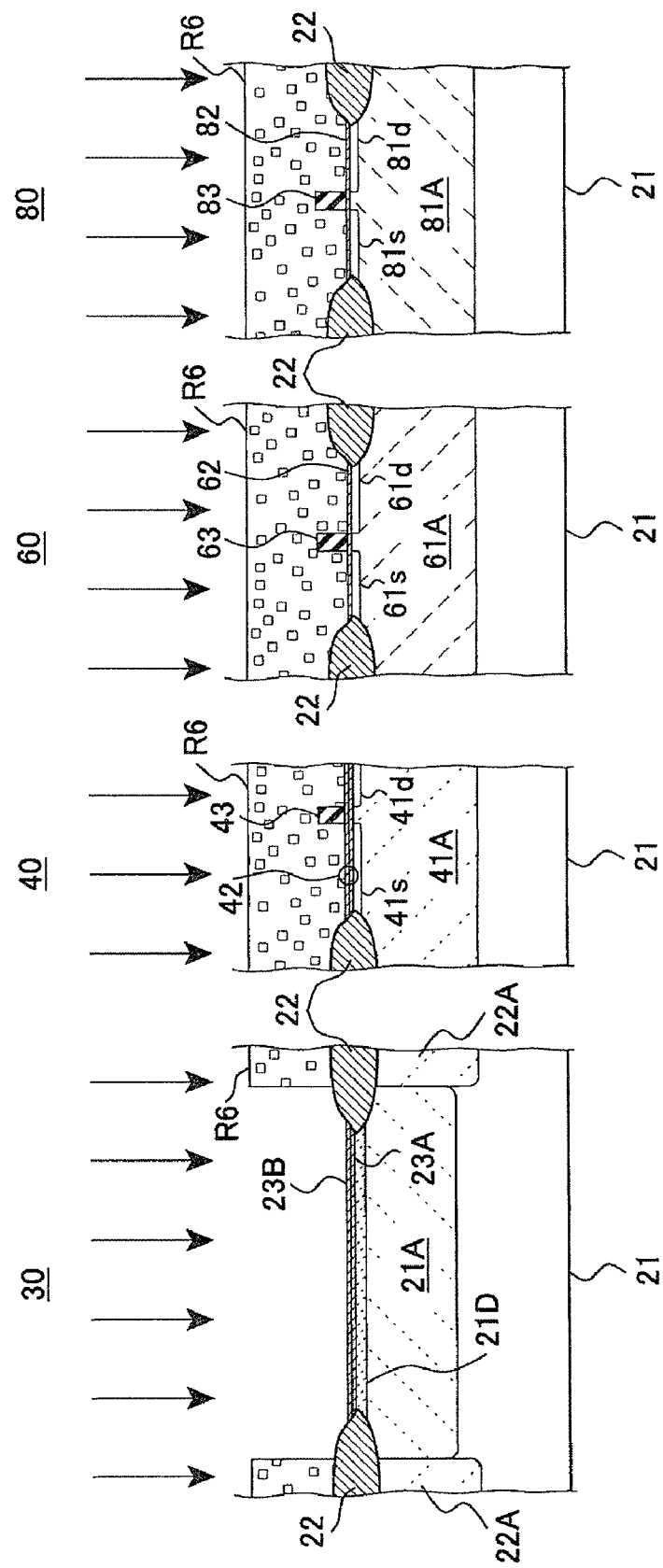

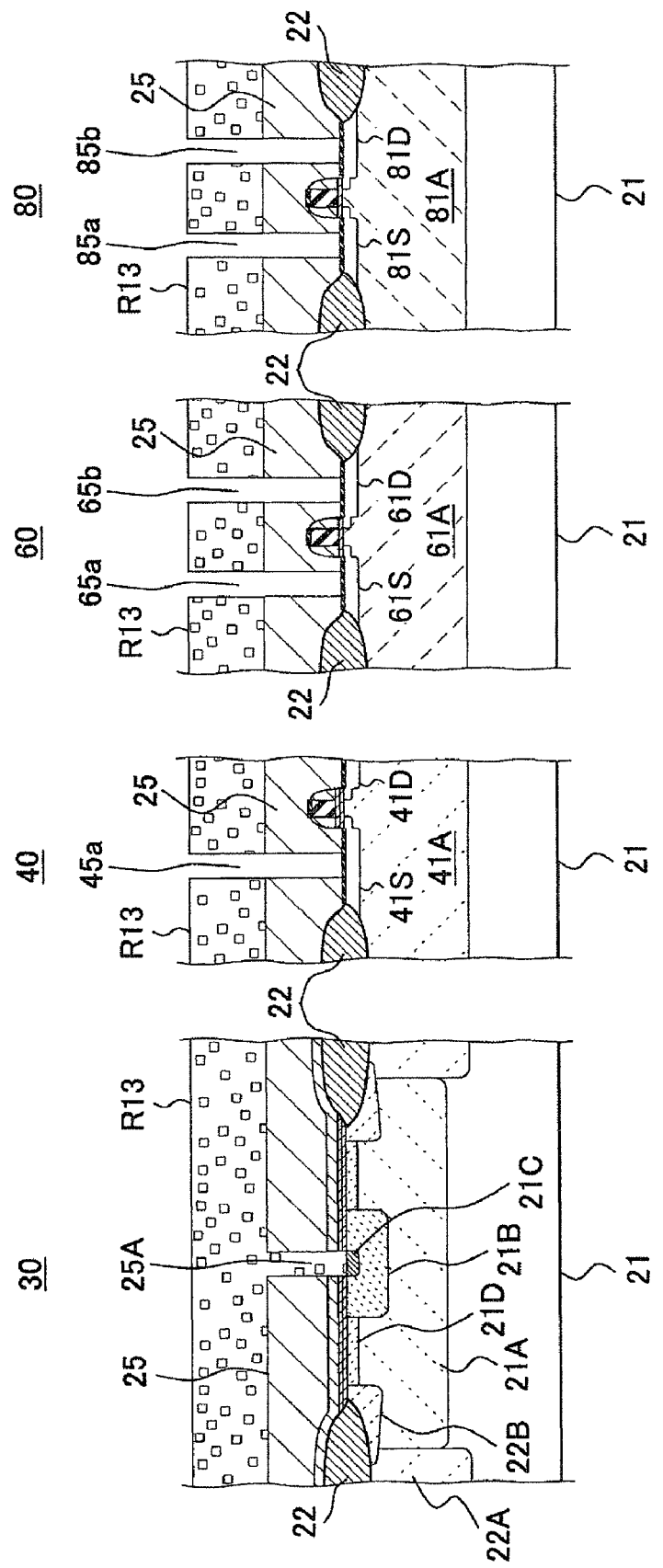

PHOTODIODE, SOLID SLATE IMAGE SENSOR, AND METHOD OF MANUFACTURING THE SAME

CROSS-REFERENCE TO RELATED APPLICATION

The present application is a continuation application filed under 35 U.S.C. 111(a) claiming benefit under 35 U.S.C. 120 and 365(c) of PCT International Application No. PCT/JP2005/015838, filed on Aug. 31, 2005, the entire contents of which are hereby incorporated by reference.

BACKGROUND

1. Field

The present embodiments relate generally to semiconductor devices, and more particularly to a photodiode forming a CMOS image sensing device, a solid state image sensor, and a method of manufacturing the same.

2. Description of the Related Art

Nowadays, CMOS image sensing devices are widely used in cellular phones with a camera, digital still cameras, etc. Compared with CCD image sensing devices, CMOS image sensing devices have the preferable characteristics of being simple in configuration and formable at low cost.

FIG. 1 shows a configuration of such a CMOS image sensing device 100.

Referring to FIG. 1, the CMOS image sensing device 100 has a light-receiving region 101A where multiple light-receiving elements 10 are arranged in a matrix manner. A row selector circuit 101B and a signal readout circuit 101C cooperate with each other with respect to each light-receiving element 10. Here, the row selector circuit 101B selects a reset control line RST and a selection control line SEL, while the signal readout circuit 101C supplies a reset voltage to a reset voltage line $V_R$ and reads out a signal voltage from a pixel output to a signal readout line SIG.

FIG. 2 shows a configuration of the light-receiving element 10 of one pixel used in the CMOS image sensing device 100 of FIG. 1.

Referring to FIG. 2, a photodiode 10D is connected in a reverse-biased direction to a power supply terminal 10A, which is connected to the reset voltage line $V_R$ so as to have a predetermined reset voltage supplied thereto, through a reset transistor 10B controlled by a reset signal on the reset control line RST. Photoelectrons formed by light exposure in the photodiode 10D are converted into voltage by a readout transistor 10F forming a source follower circuit driven by supply voltage from the power supply terminal 10A, and are output. The output is output onto the signal line SIG by a selection transistor 10S connected in series to the readout transistor and controlled by a selection control signal on the selection control line SEL.

FIG. 3A is a plan view showing a configuration of a photodiode 100D used in such a CMOS image sensing device according to the related art of the present invention. FIG. 3B is a cross-sectional view of the photodiode taken along the line X-X'. The photodiode 100D of FIGS. 3A and 3B is used as the photodiode 10D in the CMOS pixel element 10 of FIG. 2.

Referring to FIGS. 3A and 3B, the photodiode 100D is formed on a p-type silicon substrate 111. A device region that defines the photodiode 10D with an isolation insulating film 112 by LOCOS and a p-type channel stopper region 112A thereunder is formed on the p-type silicon substrate 111.

Further, an n⁻ diffusion region 111A is formed as a light-receiving region in the device region.

At the operating time of the photodiode 100D, a depletion layer is formed by reverse bias in the light-receiving region 111A so that photoelectrons formed in the light-receiving regions 111A reach a signal electrode, thereby forming a light signal. At this point, in order to increase the sensitivity of the photodiode, the light-receiving region 111A is required to be extremely low in defect density so as to minimize generation of dark current due to thermionic emission and prevent the formed photoelectrons from being captured to disappear on the way or prevent thermions from being emitted into the photoelectrons.

Therefore, according to the configuration of FIGS. 3A and 3B, a p-type guard ring 112B is formed between the light-receiving region 111A and the LOCOS oxide film 112 so as to avoid direct contact of the n⁻ diffusion region 111A with the surface of the isolation insulating film 112. Further, a p-type shield layer 111D is also formed in the surface part of the silicon substrate 111, that is, the surface part of the light-receiving region 111A, thereby avoiding exposure of the light-receiving region at the surface of the silicon substrate 111 containing defects.

Further, an n⁺ diffusion region 111C is formed so as to be surrounded by the p-type shield layer 111D in part of the surface part of the light-receiving region 111A as a contact layer with the signal electrode. In general, such an n⁺ diffusion region 111C contains defects at high density. Accordingly, an n-type diffusion region 111B is formed so as to cover the contact layer 111C in the n⁻ light-receiving region 111A, thereby avoiding direct contact of the light-receiving region 111A and the n⁺ contact layer 111.

Further, a thermal oxide film 113 is formed on the surface of the silicon substrate 111, and a CVD oxide film 114 is further formed thereon. An interlayer insulating film 115 is formed on the CVD oxide film 114. A via plug 116 is formed in the interlayer insulating film 115 so as to be in contact with the contact layer 111C. A signal electrode 117 is formed in contact with the via plug 116 on the interlayer insulating film 115.

FIG. 4 shows the vicinity of the n-type diffusion region 111B of FIG. 3B on an enlarged scale.

Referring to FIG. 4, the depletion region extending from a junction interface PN1 of the p-type silicon substrate 111 and the n⁻ light-receiving region 111A extends over the substantially entire light-receiving region 111A, so that an end part A of the depletion region in the n-side region reaches as far as the n-type diffusion region 111B. Further, the depletion region extending from a junction interface PN2 of the n⁻ light-receiving region 111A and the p-type shield layer 111D is formed so as to combine with the depletion region extending from the junction interface PN1 to have an end part C positioned near the interface PN2 with the light-receiving region 111A in the shield layer 111D.

It is necessary for the contact layer 111C to realize good ohmic junction with the via plug 116. Therefore, the contact layer 111C is heavily doped. On the other hand, a defect D such as dislocation is likely to be caused in this heavily-doped contact layer 111C. Therefore, if the depletion region extends so that its end part A goes beyond the defect D as shown in FIG. 4, carriers such as photoelectrons generated in the depletion region are captured so that leakage current is generated. Further, a large electric field is formed between the heavily-doped contact layer 111C and the p-type shield layer 111D, causing a problem in that leakage current is also likely to be generated in this part. Such leakage current forms dark current so as to decrease the sensitivity of the photodiode.

Further, according to the related art in FIG. 4, the contact layer 111C is formed to be large with respect to the diameter of the via plug 116 so as to ensure allowance for alignment error. However, since the contact layer 111C, in which no depletion region is formed, or the n-type region 111B, which the depletion region hardly enters, takes no part in light receiving, it is necessary to reduce the dimension W of these parts as much as possible in order to increase the photoelectric conversion efficiency of the photodiode 10D.

Meanwhile, FIG. 5 shows the configuration of a conventional photodiode 100E described in Patent Document 1 and Patent Document 2. In FIG. 5, the parts corresponding to those described above are given the same reference numerals, and a description thereof is omitted. Further, in FIG. 5, only parts necessary for description are graphically illustrated, and a graphical illustration of the other parts is omitted.

Referring to FIG. 5, in the photodiode 100E, the n-type diffusion region 111B is formed so as to envelop the $n^+$ contact layer 111, so that the extension of the depletion region from the junction interface PN1 not graphically illustrated is substantially blocked by the n-type diffusion region 111B and prevented from reaching the contact layer 111C containing defects. Further, the depletion region formed at the interface between the shield layer 111D and the n-type diffusion region 111B is confined in the vicinity of the interface and prevented from reaching the contact layer 111C because of the high impurity densities of the layers 111B and 111D. Further, since the n-type diffusion region 111B, lower in impurity density than the $n^+$ contact layer 111C, is interposed between the $n^+$ contact layer 111C and the p-type shield layer 111D, leakage current is prevented from being generated between the contact layer 111C and the shield layer 111D.

Thus, the configuration of FIG. 5 produces an excellent effect in reducing dark current, but has a problem in that the extent of the depletion region extending from the junction interface PN1 is limited so as to reduce the photoelectric conversion efficiency because the n-type diffusion region 111B extends up to the part under the p-type shield layer 111D. Further, in such a structure, the photoelectric conversion efficiency is not improved no matter how much the contact layer 111 may be microfabricated by increasing the accuracy of patterning, unless the diffusion region 111B is reduced in size. However, as long as the diffusion region 111B is formed so as to be in contact with the lower surface of the shield layer 111D, the fabrication of the diffusion region 111B has its limits.

[Patent Document 1] Japanese Laid-Open Patent Application No. 2000-312024

[Patent Document 2] Japanese Laid-Open Patent Application No. 2004-312039

SUMMARY

It is an aspect of the embodiments discussed herein to provide a photodiode formed over a silicon substrate, including a light-receiving region formed of a diffusion region of a first conduction type at a surface of the silicon substrate and forming a pn junction, an intermediate region formed of a diffusion region of the first conduction type at the surface of the silicon substrate so as to be included in the light-receiving region, a contact region formed of a diffusion region of the first conduction type at the surface of the silicon substrate so as to be included in the intermediate region, a shield layer formed of a diffusion region of a second conduction type in a part of the surface of the silicon substrate outside the intermediate region, and an electrode in contact with the contact region, wherein the shield layer faces a side end part of the diffusion region forming the intermediate region.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

Other objects, features and advantages of the present invention will become more apparent from the following detailed description when read in conjunction with the accompanying drawings, in which:

FIG. 8A is a (first) diagram showing a method of manufacturing a solid state image sensing device according to a second embodiment of the present invention;

FIG. 8B is a (second) diagram showing the method of manufacturing a solid state image sensing device according to the second embodiment of the present invention.

FIG. 8K is a (11th) diagram showing the method of manufacturing a solid state image sensing device according to the second embodiment of the present invention;

FIG. 8O is a (15th) diagram showing the method of manufacturing a solid state image sensing device according to the second embodiment of the present invention;

FIG. 8U is a (21st) diagram showing the method of manufacturing a solid state image sensing device according to the second embodiment of the present invention.

DETAILED DESCRIPTION OF THE PREFERRED EMBODIMENTS

A description is given below, with reference to the accompanying drawings, of embodiments of the present invention.

First Embodiment

Figure 6A:
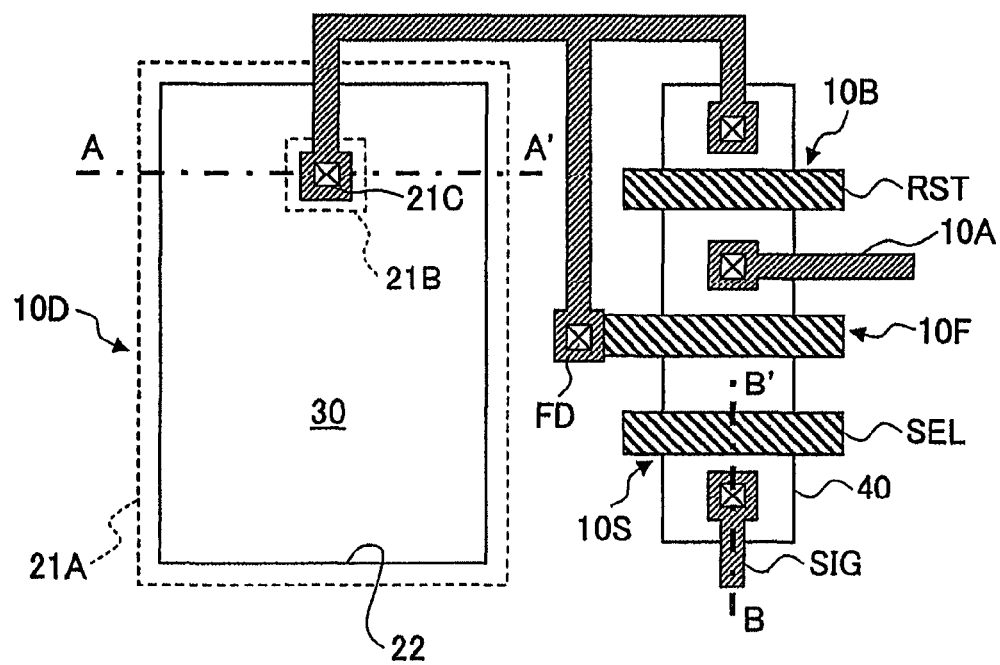
FIG. 6A is a plan view showing a configuration of one pixel of a solid state image sensing device according to a first embodiment of the present invention.
Figure 6B:
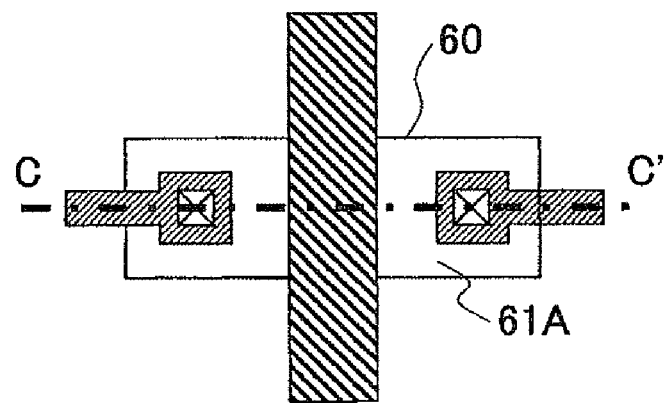
FIG. 6B is a plan view showing an n-channel MOS transistor forming a CMOS device cooperating with the solid state image sensing device according to the first embodiment of the present invention.
Figure 6C:
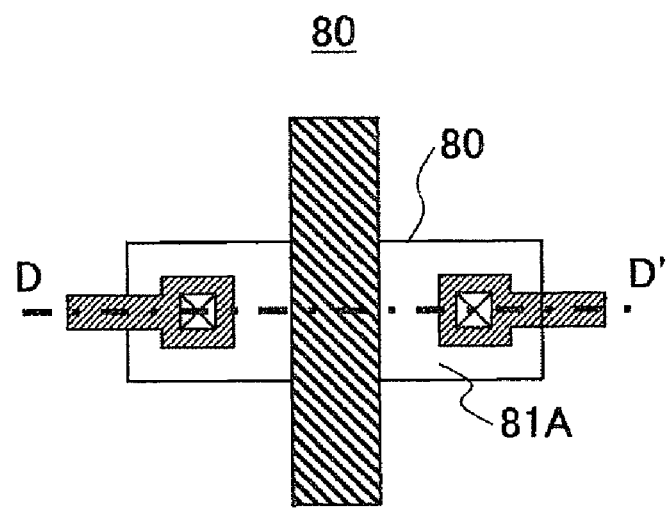
FIG. 6C is a plan view showing a p-channel MOS transistor forming the CMOS device cooperating with the solid state image sensing device according to the first embodiment of the present invention.

FIGS. 6A through 6C are plan views showing a configuration of a solid state image sensing device 20 according to a first embodiment of the present invention. FIGS. 7A through 7D are cross-sectional views taken along the lines A-A', B-B', C-C', and D-D', respectively, in FIGS. 6A through 6C. Of those, FIG. 6A shows a plan view showing an overall configuration of the solid state image sensing device 20, and FIGS. 6B and 6C show plan views of an n-channel MOS transistor and a p-channel MOS transistor, respectively, which are not shown in the plan view of FIG. 6A and form a CMOS logic element that cooperates with the solid state image sensing device 20.

Figure 7A:
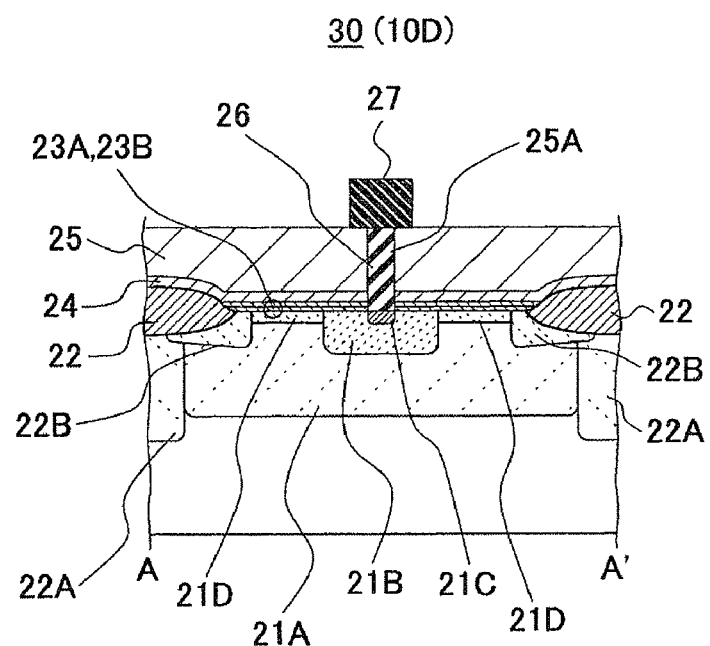
FIG. 7A is a cross-sectional view showing a configuration of a photodiode used in the solid state image sensing device of FIG. 6A.

Referring to FIG. 6A and FIG. 7A, the solid state image sensing device 20 corresponds to the equivalent circuit diagram of the light-receiving element shown above in FIG. 2, and has the photodiode 10D and the reset transistor 10B connected in series to an interconnect pattern forming the power supply terminal 10A. Further, the readout transistor 10F, to which a light signal from the photodiode 10D is fed, and the selection transistor 10S, which is activated by the selection signal SEL, are connected in series to the power supply terminal 10A.

The photodiode 10D is formed in a device region 30 defined by an isolation insulating film 22 formed by LOCOS on a p-type silicon substrate 21. An $n^-$ light-receiving region 21A is formed in the device region 30.

More specifically, as shown in the cross-sectional view of FIG. 7A, the $n^-$ light-receiving region 21A is formed in the p-type silicon substrate 21 so as to correspond to the device region 30 defined by the isolation insulating film 22, and a p-type shield layer 21D is formed at the surface of the device region 30.

Further, a p-type channel stopper 22A is formed under the isolation insulating film 22 so as to laterally surround the light-receiving region 21A under the isolation insulating film 22. Further, a p-type guard ring 22B is formed along the inside edge of the isolation insulating film 22 so as to prevent direct contact between the light-receiving region and the isolation oxide film 22. The light-receiving region 21A forms a pn junction with the p-type silicon substrate 21 at its lower end, and forms a pn junction with the p-type shield layer 21D.

Further, in the light-receiving region 21A, a fine $n^+$ contact region 21C is formed in contact with the surface of the silicon substrate 21, canceling the conduction type of the p-type shield layer 21D, and likewise, an n-type intermediate region 21B is formed so as to envelop the contact region 21C, canceling the conduction type of the $p^+$ shield layer 21D. That is, the intermediate region 21B is higher in the density of an n-type impurity element and in electron density than the light-receiving region 21A, and the contact region 21C is higher in the density of an n-type impurity element and in electron density than the intermediate region 21B.

Here, the intermediate region 21B is formed in contact with the surface of the silicon substrate 21, so that the shield layer 21D is formed outside the intermediate region 21B so as to be in contact with the side end part of the intermediate region. In this embodiment, this configuration prevents direct contact between the p-type shield layer 21D and the contact region 21C. As a result, the depletion region extending from the pn junction interface between the silicon substrate 21 and the light-receiving region 21A is prevented from further extending by the intermediate region 21B, so as to be prevented from reaching the contact region 21C. This prevents generation of leakage current due to defects in the contact region 21C, thus preventing dark current. Further, the interposition of the intermediate region 21B of an intermediate density between the p-type shield layer 21D and the n+ contact layer 21C also prevents generation of leakage current due to an abrupt pn junction.

Further, according to the configuration of FIGS. 6A and 7A, the intermediate region 21B is formed with its side end part being in contact with the p-type shield layer 21D surrounding the intermediate region 21B. Therefore, for example, by microfabricating the intermediate region 21B as well as microfabricating the contact region 21C, it is possible to freely increase the effective volume of the light-receiving region 21A, so that it is possible to improve the photoelectric conversion efficiency of the photodiode.

Insulating films 23A and 23B such as thermal oxide films are further formed successively on the surface of the silicon substrate 21. An interlayer insulating film 25 is formed on the insulating film 23B with a CVD oxide film 24 interposed therebetween.

Further, a contact hole 25A that exposes the contact region 21C in the silicon substrate 21 is formed in the interlayer insulating film 25. A conductive plug 26 of W or the like is formed in the contact hole 25A so as to be in ohmic contact with the contact region 21C. Further, an interconnect pattern 27 is formed on the interlayer insulating film 25.

Figure 7B:
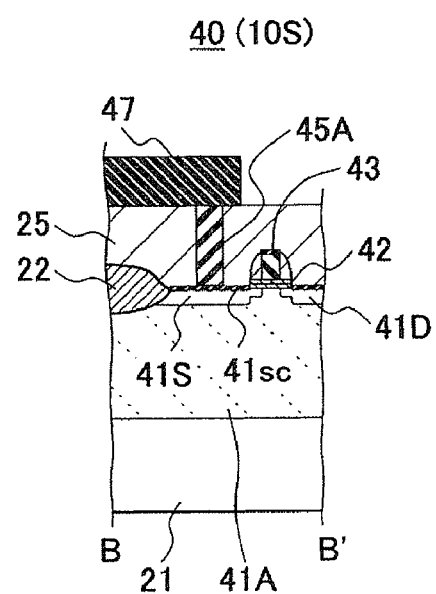
FIG. 7B is a cross-sectional view showing a configuration of an n-channel MOS transistor used in the solid state image sensing device of FIG. 6A.

Next, a description is given, with reference to FIG. 6A and FIG. 7B, of a configuration of an n-channel MOS transistor used as the selection transistor 10S. The same configuration is also applied to the reset transistor 10B and the readout transistor 10F.

Referring to FIG. 6A and FIG. 7B, a p-type well 41A is formed in a device region 40 defined by the isolation oxide film 22 on the silicon substrate 21, and a gate electrode 43 is formed on the silicon substrate 21 so as to correspond to a channel region with a gate insulating film 42, which is a stack of the insulating films 23A and 23B, being interposed therebetween.

The gate electrode 43 carries a sidewall insulating film. Further, an n-type source region 41S including an n$^-$ LDD region and an n-type drain region 41D including an n$^-$ LDD region are formed on the corresponding outer sides of the gate electrode 43 in the p-type well 41A. A silicide layer 41sc is formed on the surfaces of the source region 41S and the drain region 41D.

Further, the interlayer insulating film 25 is formed on the silicon substrate 21 so as to cover the gate electrode 43. A conductive plug 45A of W is formed in the interlayer insulating film so as to be in contact with the source region 41S and the drain region 41D through the silicide layer 41sc. An interconnect pattern 47 is formed in contact with the conductive plug 45A on the interlayer insulating film 25.

Figure 1:
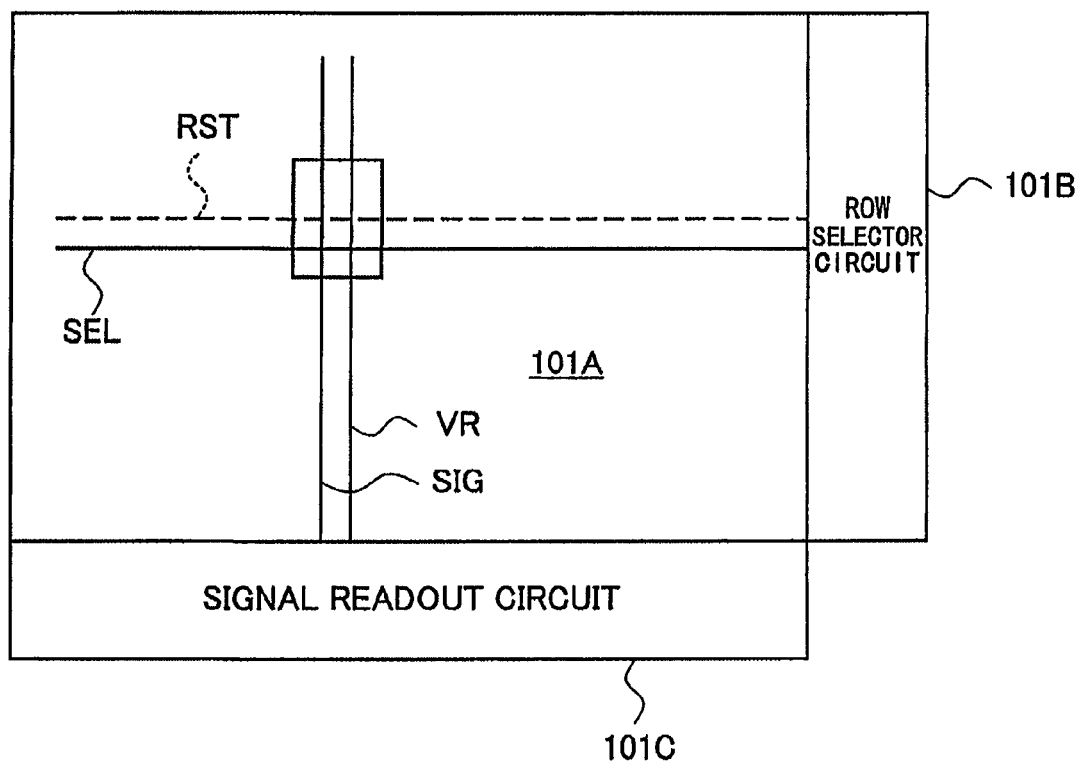
FIG. 1 is a diagram showing an overall configuration of a solid state image sensor.
Figure 2:
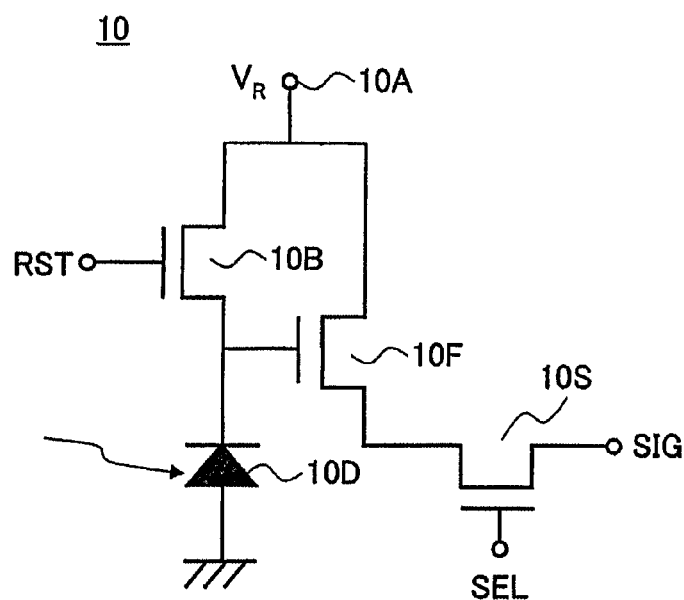
FIG. 2 is a diagram showing a circuit configuration of one pixel in the solid state image sensor of FIG. 1.
Figure 3A:
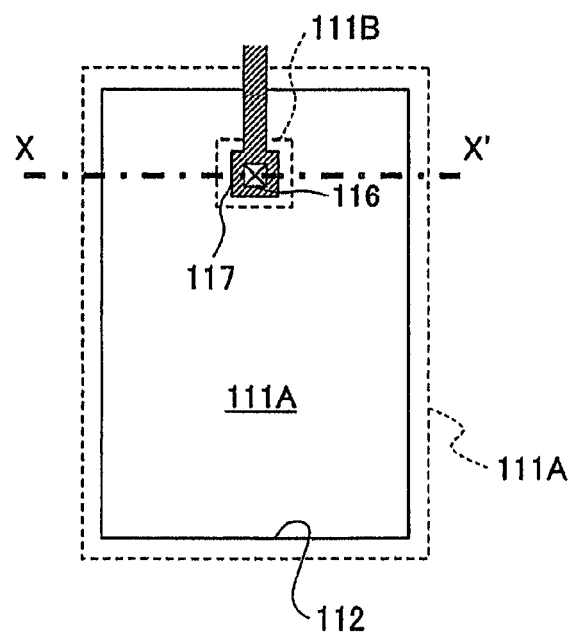
FIG. 3A is a diagram showing a plan view of a photodiode according to the related art of the present invention.
Figure 3B:
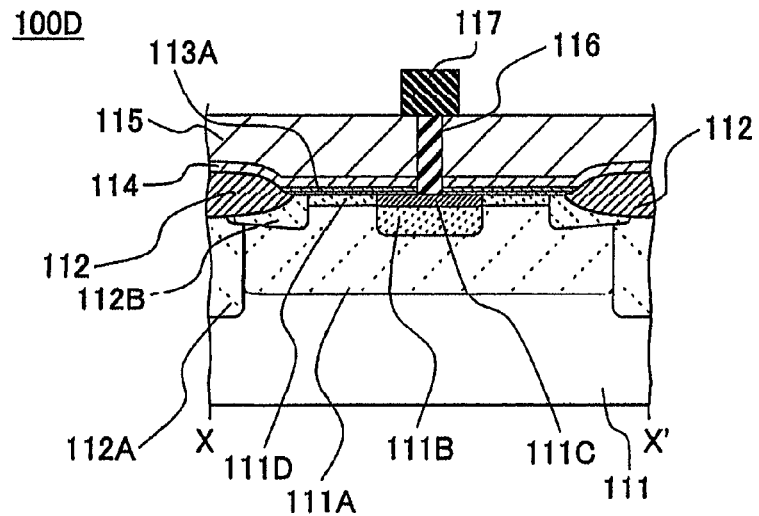
FIG. 3B is a diagram showing a cross-sectional view of the photodiode according to the related art of the present invention.
Figure 4:
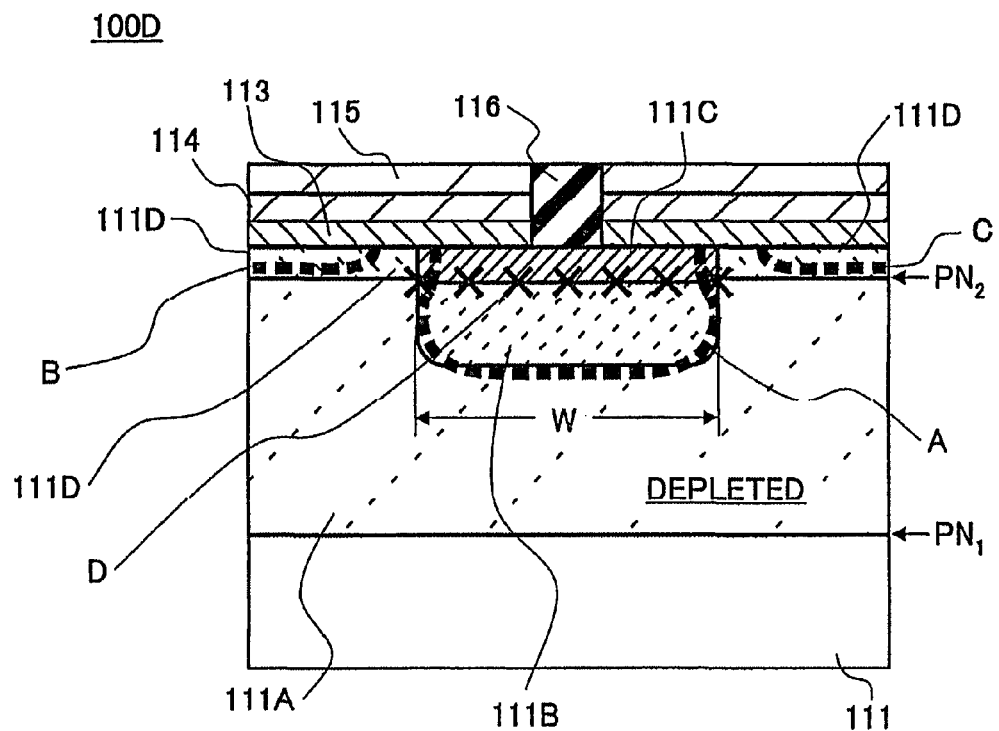
FIG. 4 is a diagram showing the cross-sectional view of FIG. 3B on an enlarged scale.
Figure 5:
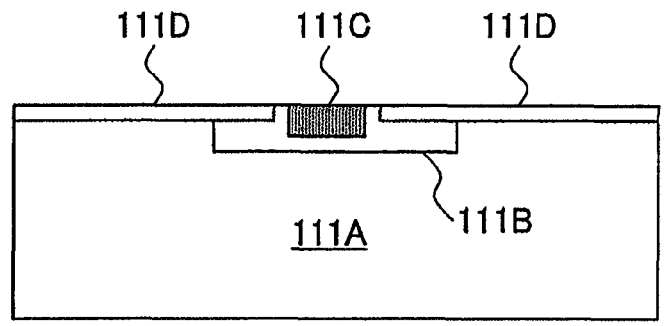
FIG. 5 is a diagram showing a cross-section of a conventional photodiode.
Figure 7C:
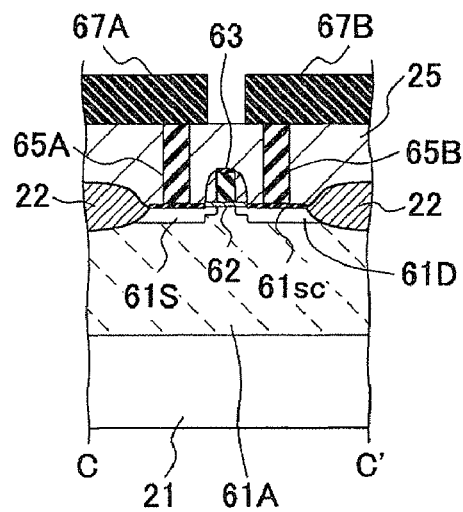
FIG. 7C is a cross-sectional view showing a configuration of the n-channel MOS transistor of FIG. 6B.

Next, a description is given, with reference to FIG. 6B and FIG. 7C, of a configuration of the n-channel MOS transistor cooperating with the light-receiving element of FIG. 2 and forming a CMOS logic circuit.

Referring to FIG. 6B and FIG. 7C, a p-type well 61A is formed in a device region 60 defined by the isolation oxide film 22 on the silicon substrate 21. A gate electrode 63 is formed on the silicon substrate 21 so as to correspond to a channel region with a gate insulating film 62 formed of the insulating film 23B being interposed therebetween.

The gate electrode 63 carries a sidewall insulating film. Further, an n-type source region 61S including an n$^-$ LDD region and an n-type drain region 61D including an n$^-$ LDD region are formed on the corresponding outer sides of the gate electrode 63 in the p-type well 61A. A silicide layer 61sc is formed on the surfaces of the source region 61S and the drain region 61D.

Further, the interlayer insulating film 25 is formed on the silicon substrate 21 so as to cover the gate electrode 63. Conductive plugs 65A and 65B of W are formed in the interlayer insulating film 25 so as to be in contact with the source region 61S and the drain region 61D, respectively, through the silicide layer 61sc. Interconnect patterns 67A and 67B are formed in contact with the conductive plugs 65A and 65B, respectively, on the interlayer insulating film 25.

Figure 7D:
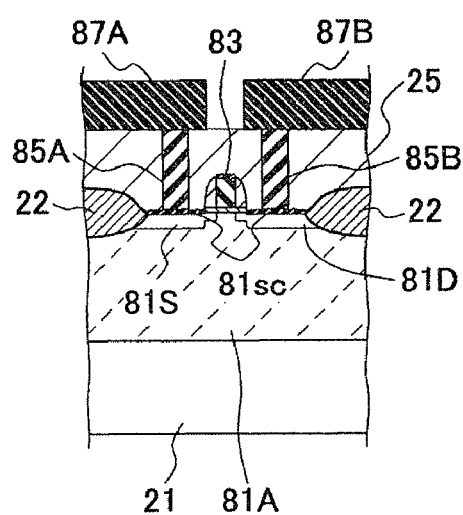
FIG. 7D is a cross-sectional view showing a configuration of the p-channel MOS transistor of FIG. 6C.

Next, a description is given, with reference to FIG. 6C and FIG. 7D, of a configuration of the p-channel MOS transistor cooperating with the light-receiving element of FIG. 2 and forming the CMOS logic circuit.

Referring to FIG. 6C and FIG. 7D, an n-type well 81A is formed in a device region 80 defined by the isolation oxide film 22 on the silicon substrate 21. A gate electrode 83 is formed on the silicon substrate 21 so as to correspond to a channel region with a gate insulating film 82 formed of the insulating film 23B being interposed therebetween.

The gate electrode 83 carries a sidewall insulating film. Further, a p-type source region 81S including a p$^-$ LDD region and a p-type drain region 81D including a p$^-$ LDD region are formed on the corresponding outer sides of the gate electrode 83 in the p-type well 81A. A silicide layer 81sc is formed on the surfaces of the source region 81S and the drain region 81D.

Further, the interlayer insulating film 25 is formed on the silicon substrate 21 so as to cover the gate electrode 83. Conductive plugs 85A and 85B of W are formed in the interlayer insulating film 25 so as to be in contact with the source region 81S and the drain region 81D, respectively, through the silicide layer 81sc. Interconnect patterns 87A and 87B are formed in contact with the conductive plugs 85A and 85B, respectively, on the interlayer insulating film 25.

Second Embodiment

Next, referring to FIGS. 8A through 8U, a description is given, with respect to each of the device regions 30, 40, 60, and 80, of a manufacturing process of the solid state image sensing device of FIGS. 6A through 6C as a second embodiment of the present invention.

In the process of FIG. 8A, the isolation oxide film 22 of 300 nm in thickness is formed on the p-type silicon substrate 21 by LOCOS so that the device regions 30, 40, 60, and 80 are defined. For example, a silicon epitaxial layer having a resistivity of 10 to 100 Ωcm and a thickness of 5 to 12 µm may be formed and used as the p-type silicon substrate 21.

Next, in the process of FIG. 8B, a resist pattern R1 that exposes only the device region 60 is formed on the structure of FIG. 8A, and the p-type well 61A is formed in the device region 60 by performing ion implantation of B$^+$ ions, using the resist pattern R1 as a mask, first at a dose of $1\times10^{13}$ to $5\times10^{13}$ cm$^{-2}$ at an acceleration voltage of 250 to 600 keV, then at a dose of $1\times10^{12}$ to $1\times10^{13}$ cm$^{-2}$ at an acceleration voltage of 60 to 100 keV, and further at a dose of $1\times10^{12}$ to $1\times10^{13}$ cm$^{-2}$ at an acceleration voltage of 15 to 40 keV.

Figure 8C:
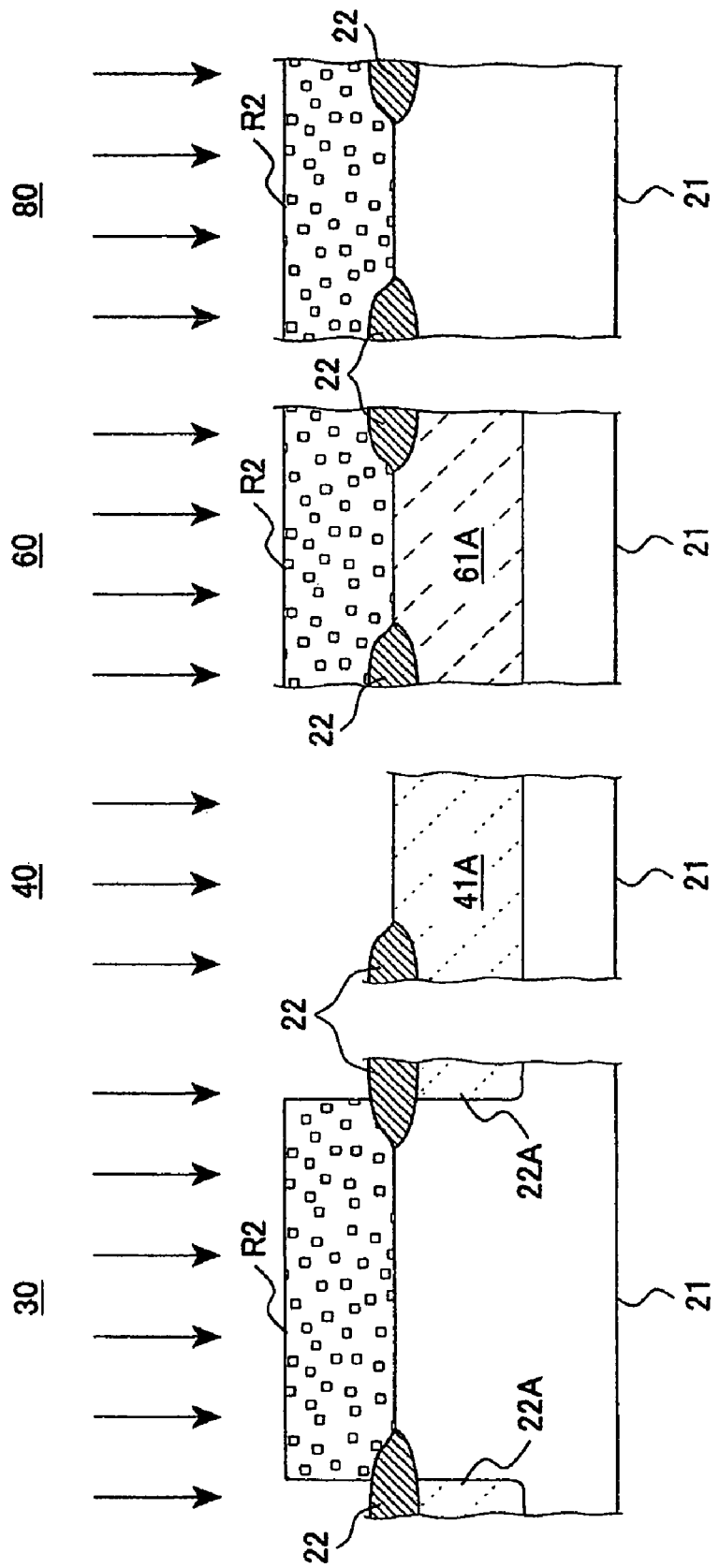
FIG. 8C is a (third) diagram showing the method of manufacturing a solid state image sensing device according to the second embodiment of the present invention.

Next, in the process of FIG. 8C, the resist pattern R1 is removed, and then a resist pattern R2 that exposes the device region 40 is formed on the structure of FIG. 8B. Further, the p-type well 41A is formed in the device region 40 by performing ion implantation of B$^+$ ions, using the resist pattern R2 as a mask, first at a dose of $1\times10^{13}$ to $5\times10^{13}$ cm$^{-2}$ at an acceleration voltage of 250 to 600 keV, then at a dose of $1\times10^{12}$ to $1\times10^{13}$ cm$^{-1}$ at an acceleration voltage of 60 to 100 keV, and further at a dose of $1\times10^{12}$ to $1\times10^{13}$ cm$^{-2}$ at an acceleration voltage of 15 to 40 keV.

Further, in the process of FIG. 8C, the channel stopper 22A is formed under the isolation oxide film 22 at the same time with the well 41A. Further, it is also possible to form the well 61A at the same time with the well 41A in the process of FIG. 8C.

Figure 8D:
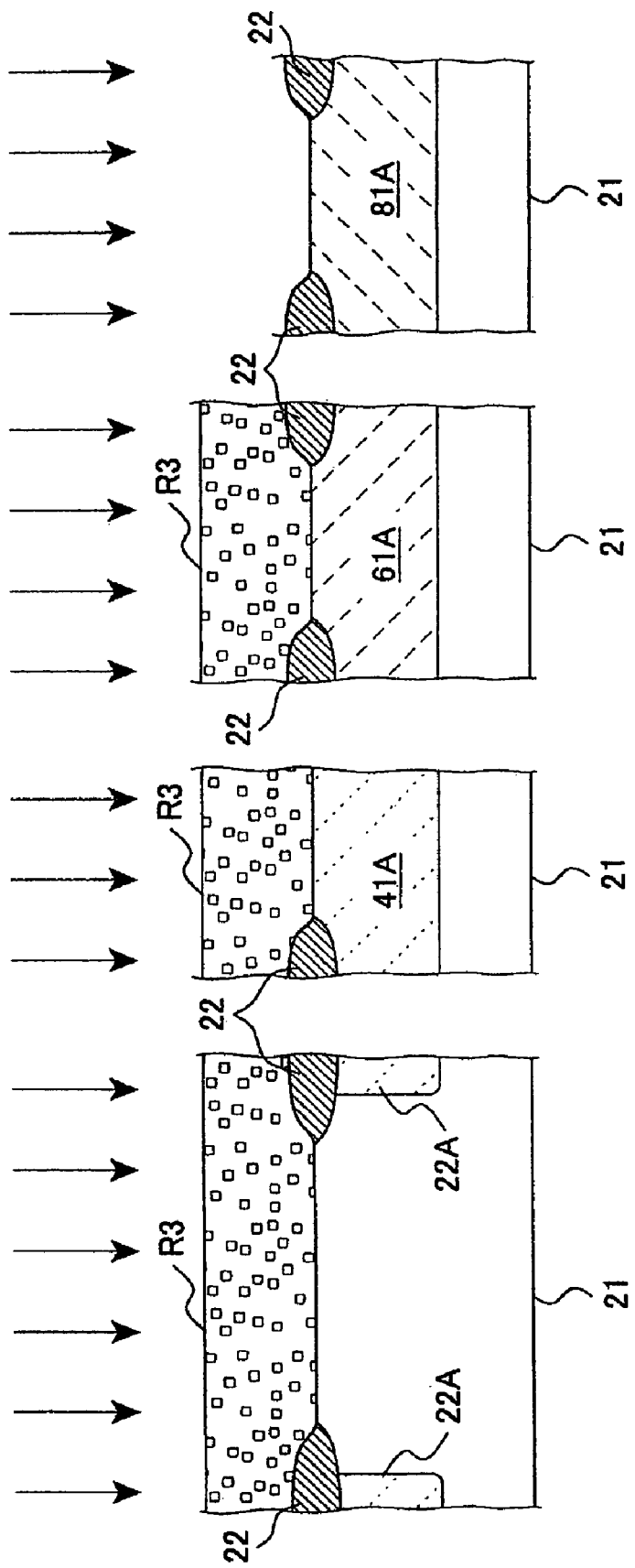
FIG. 8D is a (fourth) diagram showing the method of manufacturing a solid state image sensing device according to the second embodiment of the present invention.

Next, in the process of FIG. 8D, the resist pattern R2 is removed, and then a resist pattern that exposes the device region 80 is formed on the structure of FIG. 8B. Further, n-type well 81A is formed in the device region 80 by performing ion implantation of P$^+$ ions, using the resist pattern R3 as a mask, first at a dose of $1\times10^{13}$ to $5\times10^{13}$ cm$^{-2}$ at an acceleration voltage of 400 to 1000 keV, then at a dose of $1\times10^{12}$ to $1\times10^{13}$ cm$^{-2}$ at an acceleration voltage of 120 to 300 keV, and further at a dose of $1\times10^{12}$ to $1\times10^{13}$ cm$^{-2}$ at an acceleration voltage of 30 to 100 keV.

Figure 8E:
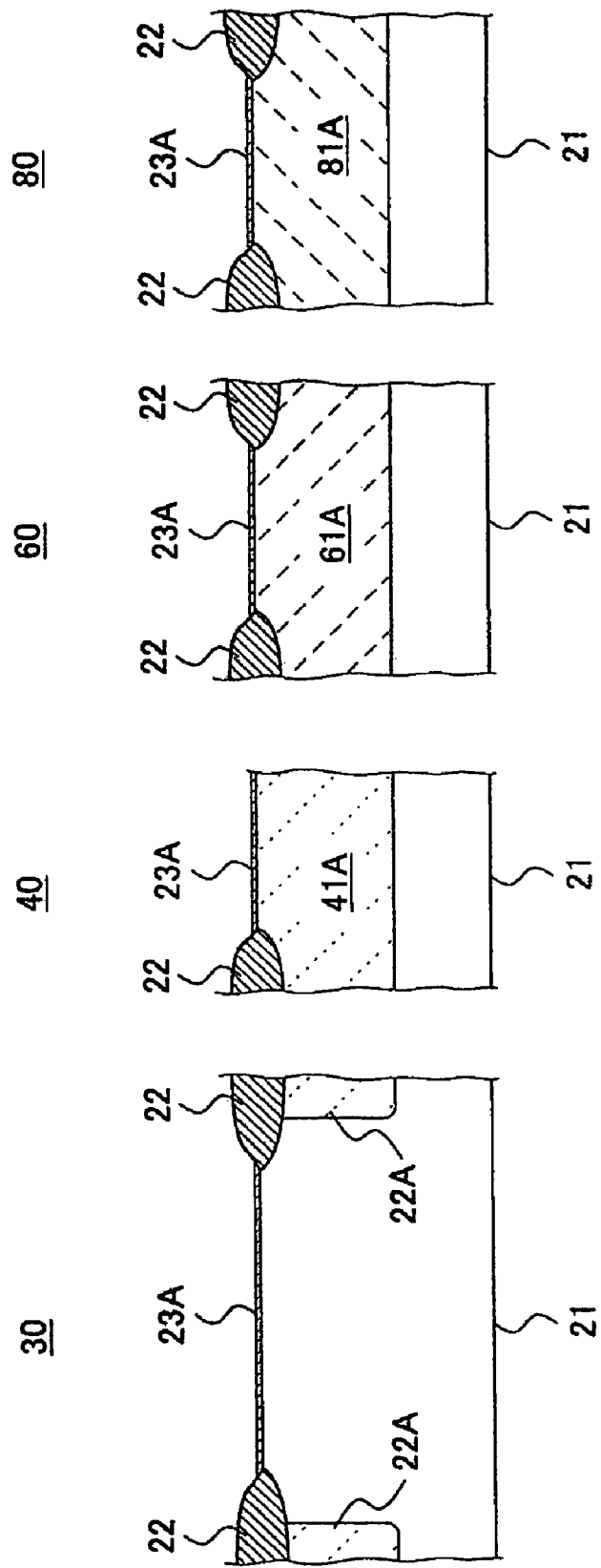
FIG. 8E is a (fifth) diagram showing the method of manufacturing a solid state image sensing device according to the second embodiment of the present invention.

Next, in the process of FIG. 8E, the resist pattern R3 is removed, and thermal oxidation is performed on the entire silicon substrate surface so that the thermal oxide film 23A of, for example, 5 nm in thickness is formed on the surface of the silicon substrate 21 in the device regions 30, 40, 60, and 80.

Figure 8F:
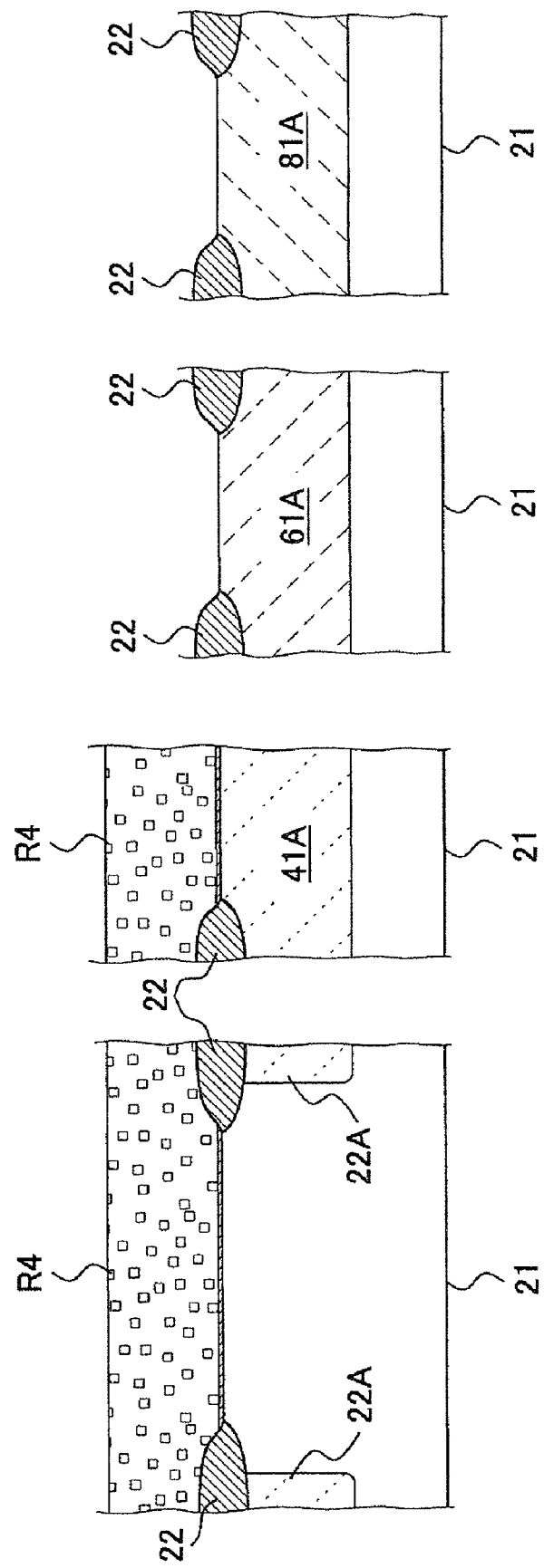
FIG. 8F is a (sixth) diagram showing the method of manufacturing a solid state image sensing device according to the second embodiment of the present invention.

Next, in the process of FIG. 8F, a resist pattern R4 that exposes the device regions 60 and 80 is formed on the structure of FIG. 8E, and the thermal oxide film 23A is removed from the device regions 60 and 80 using the resist pattern R4 as a mask.

Figure 8G:
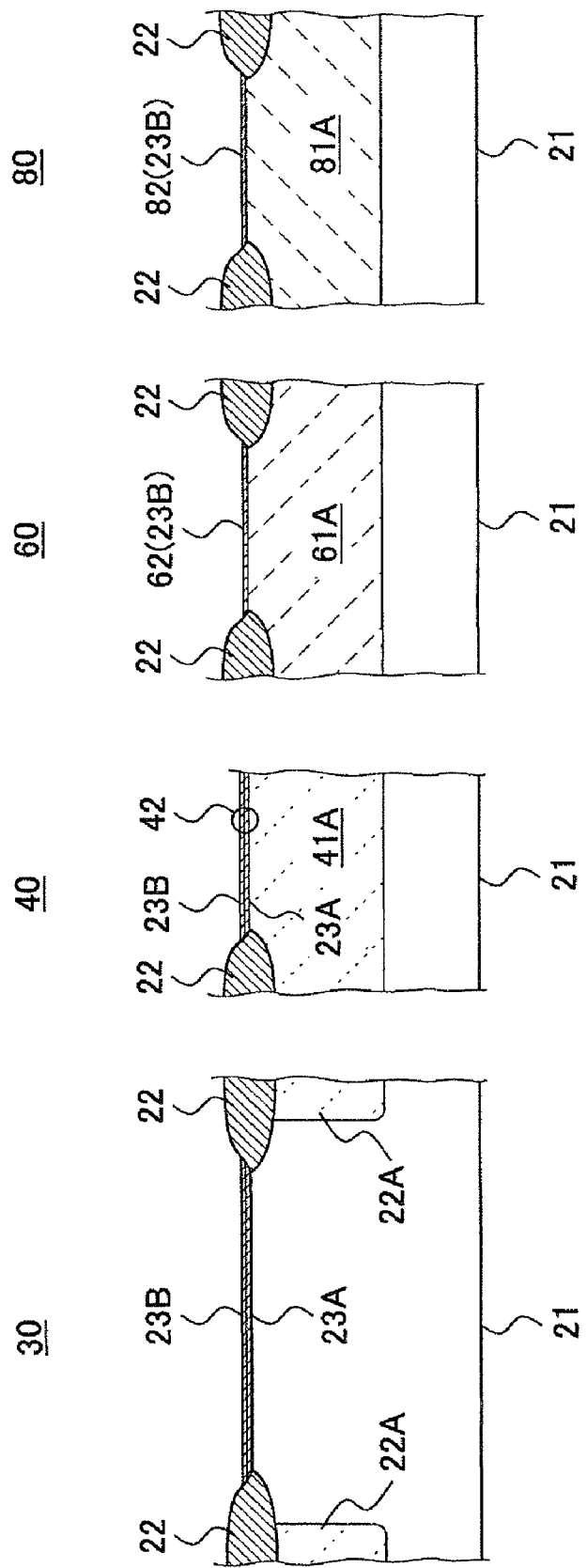
FIG. 8G is a (seventh) diagram showing the method of manufacturing a solid state image sensing device according to the second embodiment of the present invention.

Next, in the process of FIG. 8G, the resist pattern R4 is removed, and thermal oxidation is reperformed on the entire silicon substrate surface so that the thermal oxide film 23B of, for example, 5 nm in thickness is formed on the surface of the silicon substrate 21 in the device regions 60 and 80 as the gate insulating films 62 and 82, respectively. Further, in this thermal oxidation process, the thermal oxide film 23B grows on the thermal oxide film 23A in the device regions 30 and 40, so that the gate insulating film 42 is formed in the device region 40.

Figure 8H:
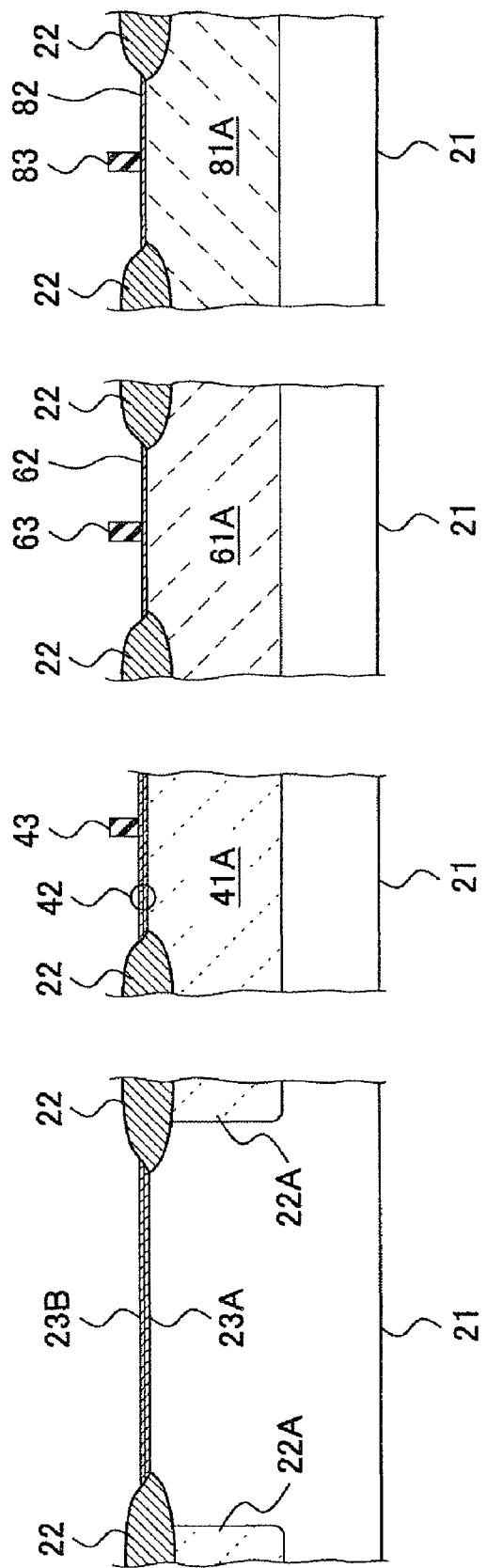
FIG. 8H is a (eighth) diagram showing the method of manufacturing a solid state image sensing device according to the second embodiment of the present invention.

Next, in the process of FIG. 8H, a polysilicon film is deposited on the structure of FIG. 8G so as to be, for example, 150 to 200 nm in thickness. Further, by patterning this, the gate electrode 43 is formed on the gate insulating film 42 in the device region 40, the gate electrode 63 is formed on the gate insulating film 62 in the device region 60, and the gate electrode 83 is formed on the gate insulating film 82 in the device region 80.

Figure 8I:
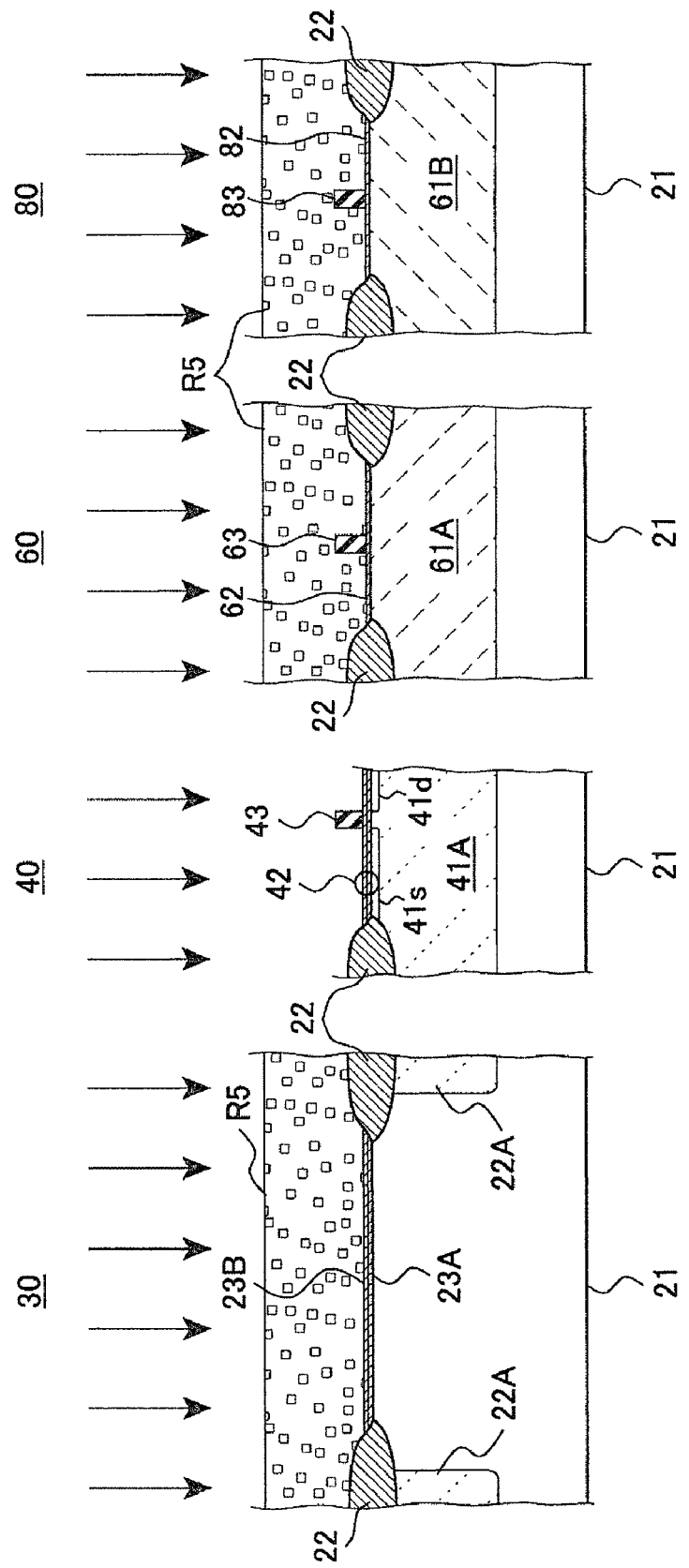
FIG. 8I is a (ninth) diagram showing the method of manufacturing a solid state image sensing device according to the second embodiment of the present invention.

Next, in the process of FIG. 8I, a resist pattern R5 that exposes the device region 40 is formed on the structure of FIG. 8H, and n-type LDD regions 41$s$ and 41$d$ are formed one on each side of the gate electrode 43 in the device region 40 by performing ion implantation of P$^+$ ions at a dose of $1\times10^{13}$ to $1\times10^{14}$ cm$^{-2}$ at an acceleration voltage of 20 keV or less using the resist pattern R5 as a mask.

Figure 8J:
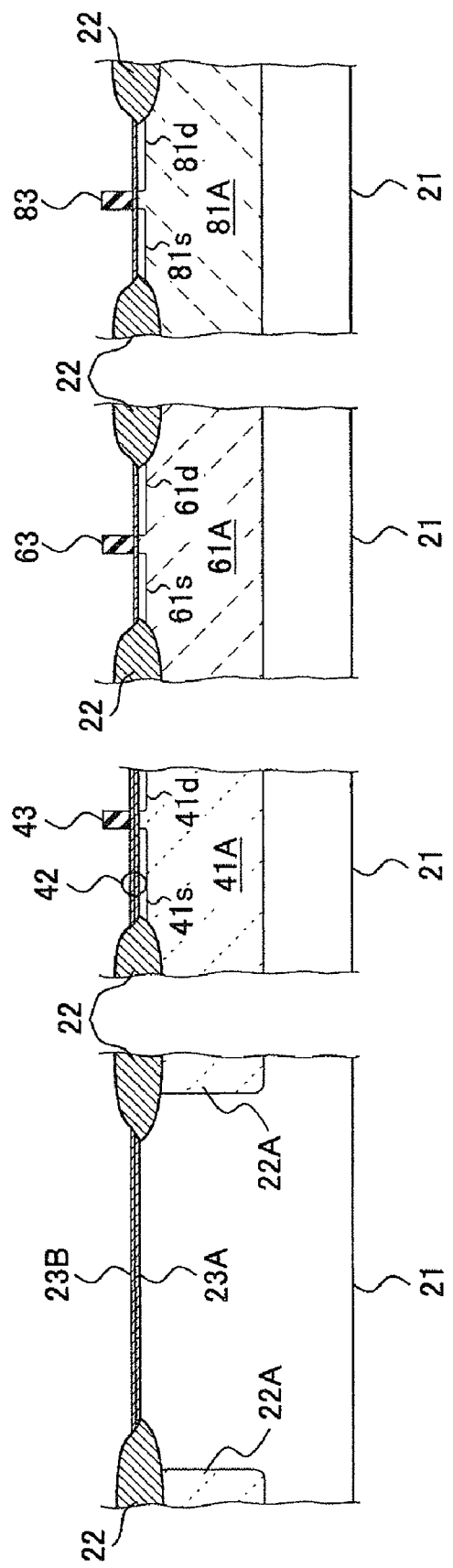
FIG. 8J is a (tenth) diagram showing the method of manufacturing a solid state image sensing device according to the second embodiment of the present invention.

Next, in the process of FIG. 8J, the resist pattern R5 is removed. Further, although not graphically illustrated, n-type LDD regions 61$s$ and 61$d$ are formed one on each side of the gate electrode 63 in the device region 60 by performing ion implantation of P$^+$ ions at a dose of $1\times10^{13}$ to $1\times10^{14}$ cm$^{-2}$ at an acceleration voltage of 20 keV or less using a resist pattern exposing the device region 60 as a mask. Thereafter, the resist pattern is removed, and p-type LDD regions 81$s$ and 81$d$ are formed one on each side of the gate electrode 83 in the device region 80 by performing ion implantation of BF$_2$$^+$ ions, newly using a resist pattern exposing the device region 80 as a mask, at a dose of $5\times10^{13}$ to $7\times10^{14}$ cm$^{-2}$ at an acceleration voltage of 15 keV or less. The process of forming the LDD regions 61$s$ and 61$d$ may also be performed at the same time with the process of FIG. 8I. Further, the process of forming the LDD regions 61$s$ and 61$d$ or the process of forming the LDD regions 81$s$ and 81$d$ may be omitted depending on desired transistor characteristics. Likewise, the process of forming the LDD regions 41$s$ and 41$d$ may also be omitted.

Next, in the process of FIG. 8K, a resist pattern R6 that exposes the device region 30, that is, the region where the photodiode 10D is to be formed, is formed on the structure of FIG. 8J, and the n$^-$ light-receiving region 21A is formed by performing ion implantation of P$^+$ ions at a dose of $5\times10^{11}$ to $1\times10^{13}$ cm$^{-2}$ at an acceleration voltage of 300 to 500 keV using the resist pattern R6 as a mask. Further, in the process of FIG. 8K, the p-type shield layer 21D is formed at the surface of the n$^-$ light-receiving region 21A by performing ion implantation of B$^+$ ions at a dose of $1\times10^{12}$ to $5\times10^{13}$ cm$^{-2}$ at an acceleration voltage of 20 keV or less using the resist pattern R6 as a mask.

Figure 8L:
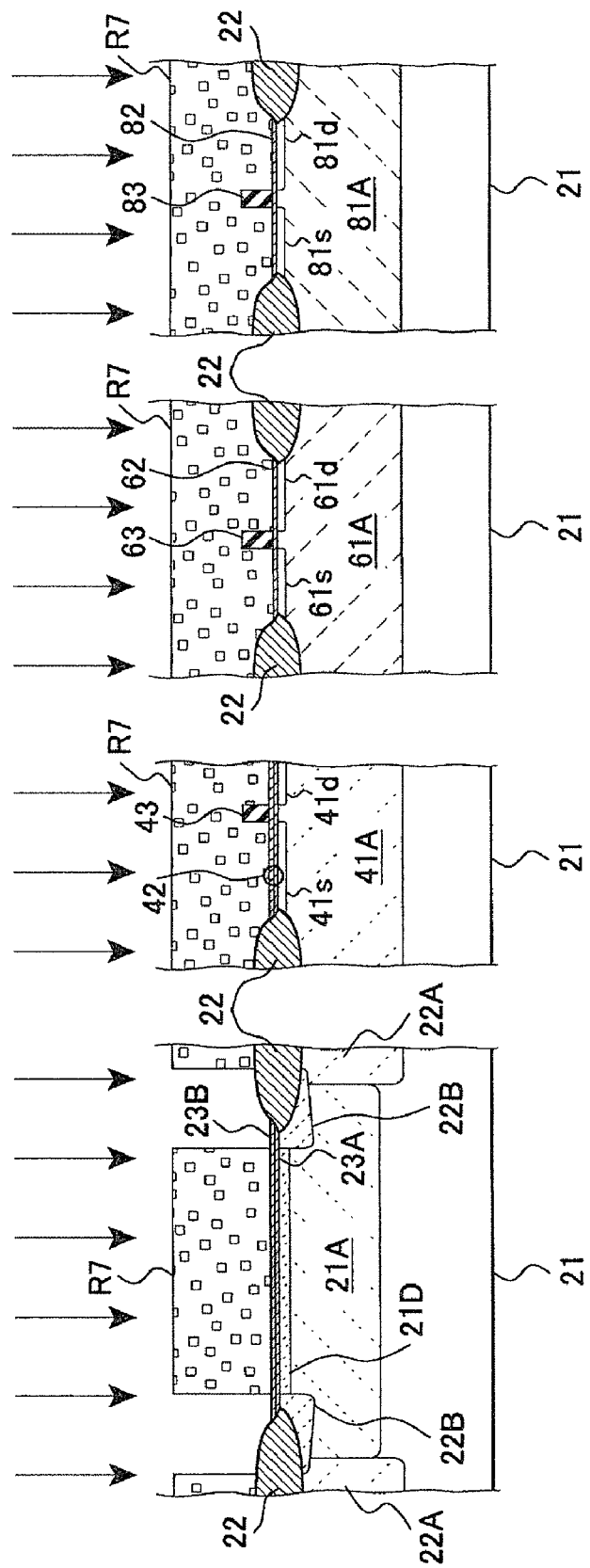
FIG. 8L is a (12th) diagram showing the method of manufacturing a solid state image sensing device according to the second embodiment of the present invention.

Further, in the process of FIG. 8L, the resist pattern R6 is removed. Further, a resist pattern R7 that exposes the inside edge part of the isolation insulating film 22 in the device region 30 is formed. Further, the p-type guard ring 22B is formed so as to surround the light-receiving region 21A by performing ion implantation of B$^+$ ions at a dose of $1\times10^{12}$ to $5\times10^{13}$ cm$^{-2}$ at an acceleration voltage of 50 to 100 keV using the resist pattern R7 as a mask.

Figure 8M:
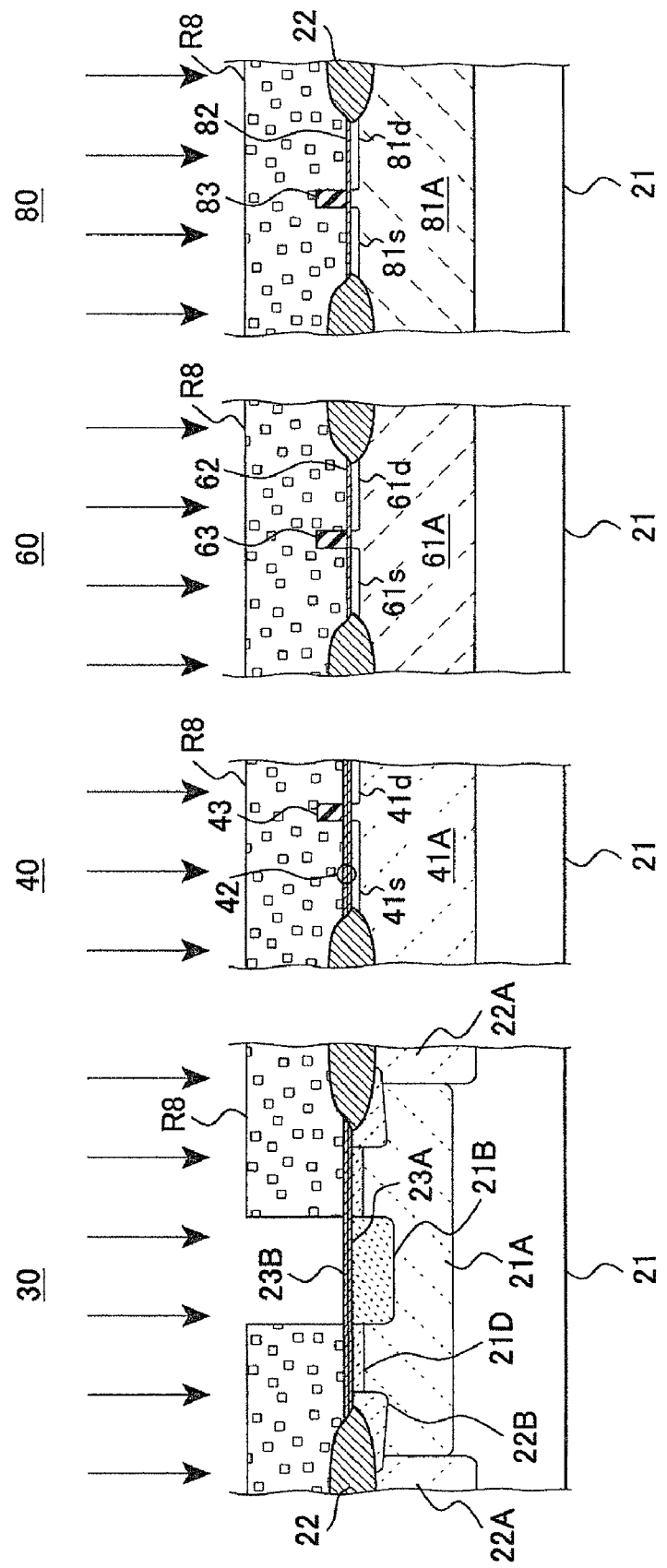
FIG. 8M is a (13th) diagram showing the method of manufacturing a solid state image sensing device according to the second embodiment of the present invention.

Next, in the process of FIG. 8M, the resist pattern R7 is removed, and a resist pattern R8 that exposes part of the device region 30 that corresponds to the intermediate region 21B is formed. Further, the n-type intermediate region 21B is formed with a higher impurity density than the n$^-$ light-receiving region 21A in the light-receiving region 21A by performing ion implantation of P$^+$ ions at a dose of $5\times10^{12}$ to $1\times10^{15}$ cm$^{-1}$ at an acceleration voltage of 30 to 100 keV using the resist pattern R8 as a mask.

Figure 8N:
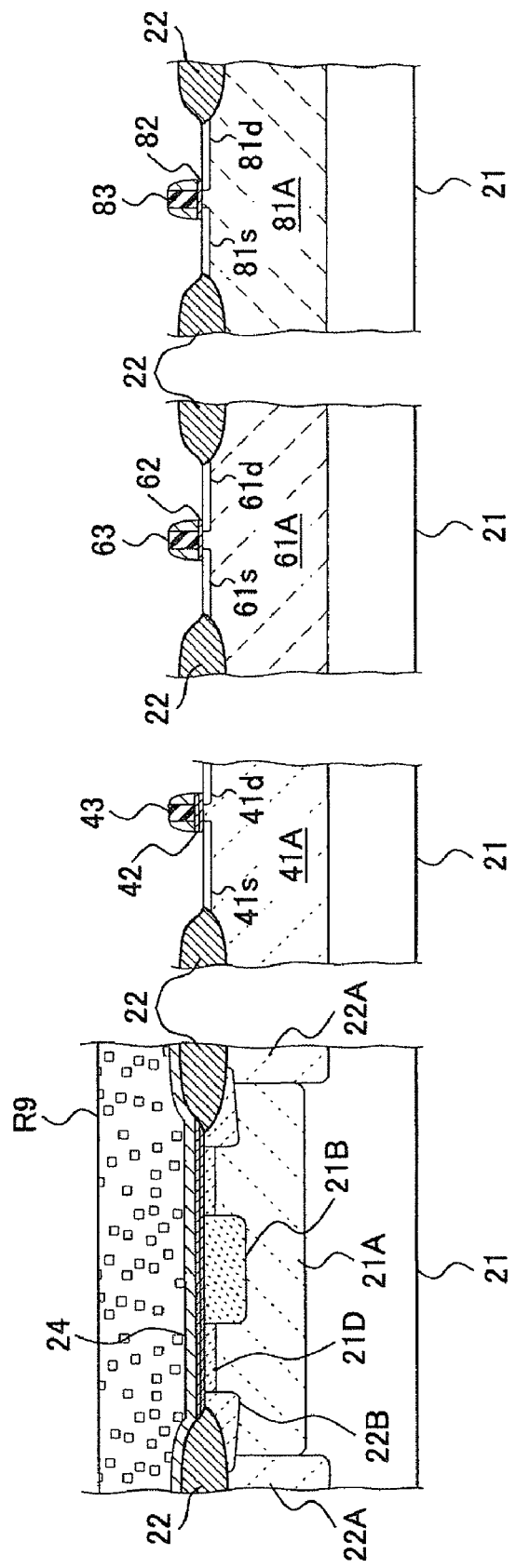
FIG. 8N is a (14th) diagram showing the method of manufacturing a solid state image sensing device according to the second embodiment of the present invention.
Figure 80:
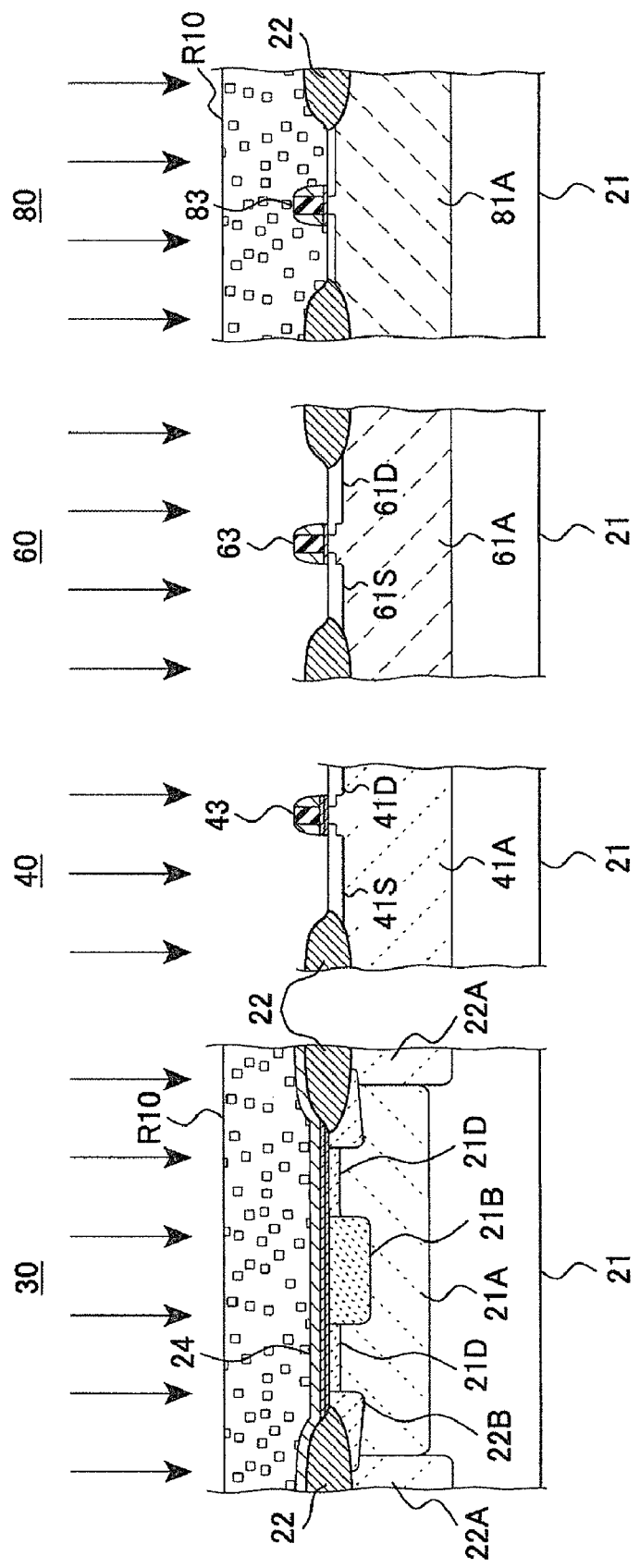

Further, in the process of FIG. 8N, the resist pattern R8 is removed, and the CVD oxide film 24 is deposited evenly on the silicon substrate 21 so as to be, for example, 100 nm in thickness and cover the device regions 30, 40, 60, and 80 including the isolation insulating film. Further, in the process of FIG. 8N, a resist pattern R9 that exposes the device regions 40, 60, and 80 is formed on the CVD oxide film 24, and etch back is performed on the CVD oxide film 24 in the device regions 40, 60, and 80 so that sidewall insulating films are formed on the gate electrodes 43, 62, and 83.

Next, in the process of FIG. 8O, the resist pattern R9 is removed. Further, a resist pattern R10 that exposes the device regions 40 and 60 is formed. Further, ion implantation of As$^+$ ions is performed at a dose of $1\times10^{15}$ to $5\times10^{15}$ cm$^{-2}$ at an acceleration voltage of 50 keV or less using the resist pattern R10 as a mask, so that the n-type source and drain regions 41S and 41D are formed one on each side of the sidewall insulating film of the gate electrode 43 in the p-type well 41A in the device region 40 and the n-type source and drain regions 61S and 61D are formed one on each side of the sidewall insulating film of the gate electrode 63 in the p-type well 61A in the device region 60.

Figure 8P:
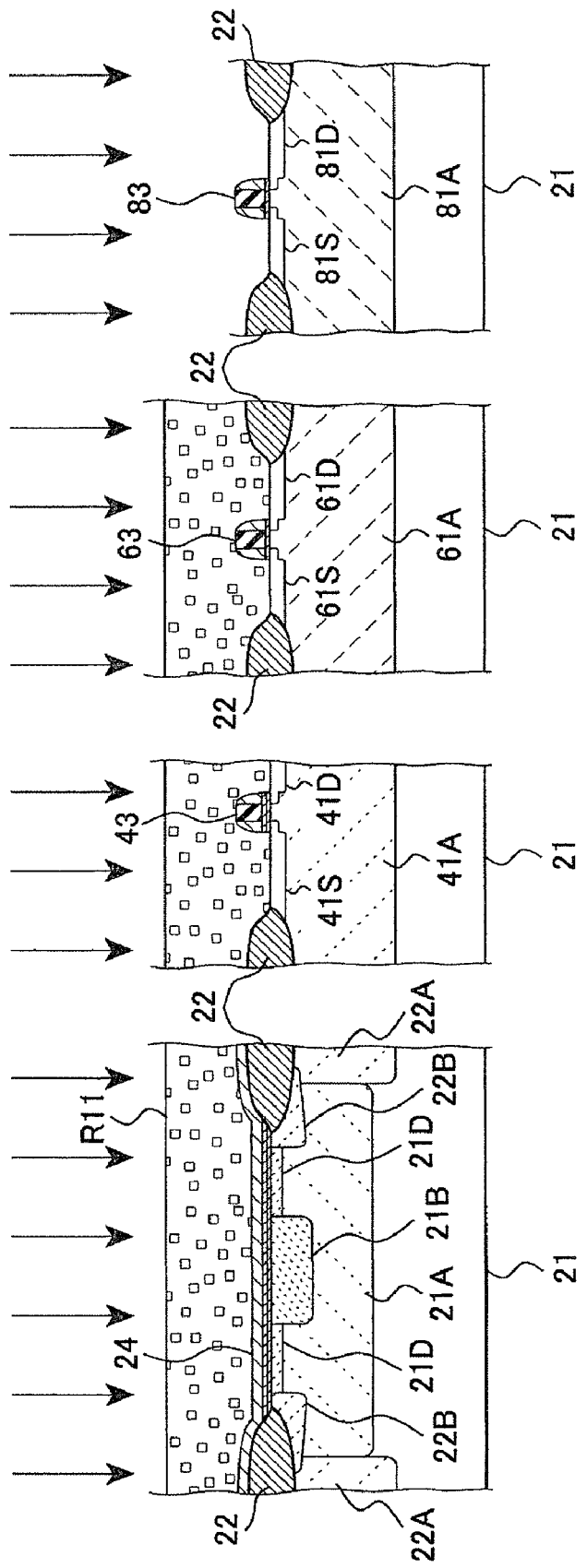
FIG. 8P is a (16th) diagram showing the method of manufacturing a solid state image sensing device according to the second embodiment of the present invention.

Next, in the process of FIG. 8P, the resist pattern R10 is removed. Further, a resist pattern R11 that exposes the device region 80 is formed. Further, ion implantation of B$^+$ ions is performed at a dose of $1\times10^{15}$ to $5\times10^{15}$ cm$^{-2}$ at an acceleration voltage of 10 keV or less using the resist pattern R11 as a mask, so that the p-type source and drain regions 81S and 81D are formed on both sides of the sidewall insulating film of the gate electrode 83.

Figure 8Q:
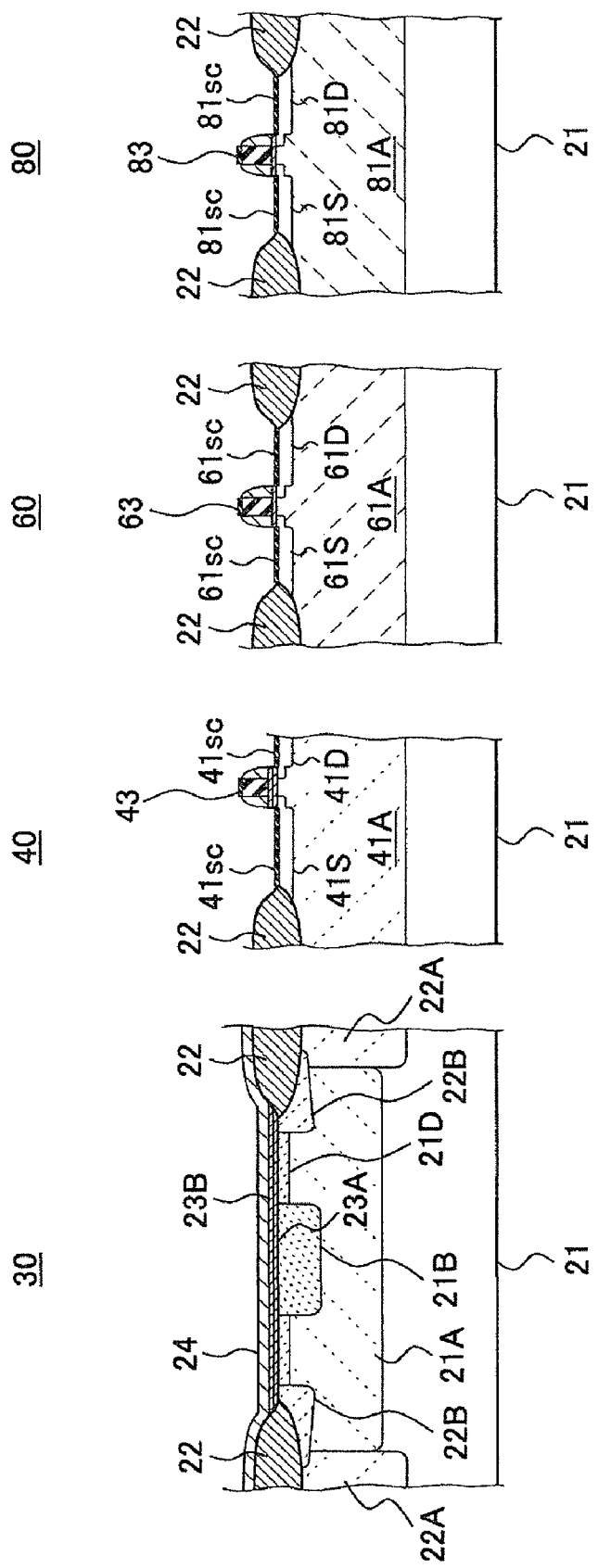
FIG. 8Q is a (17th) diagram showing the method of manufacturing a solid state image sensing device according to the second embodiment of the present invention.

Next, in the process of FIG. 8Q, the resist pattern R11 is gradually removed. Further, a Co film is deposited evenly on the device regions 30, 40, 60, and 80 by sputtering so as to be approximately 10 nm in film thickness, and further, for example, by performing heat treatment for 30 seconds at 500° C. in a nitrogen atmosphere, the silicide layer 41$sc$ is formed on the surfaces of the source and drain regions 41S and 41D, the silicide layer 61$sc$ is formed on the surfaces of the source and drain regions 61S and 61D, and the silicide layer 81$sc$ is formed on the surfaces of the source and drain regions 81S and 81D. Further, the same silicide layer is also formed on the gate electrodes 43, 63, and 83. On the other hand, no silicide is formed in the device region 30 because the silicon substrate surface is covered with the silicon oxide films 23A, 23B, and 24.

Figure 8R:
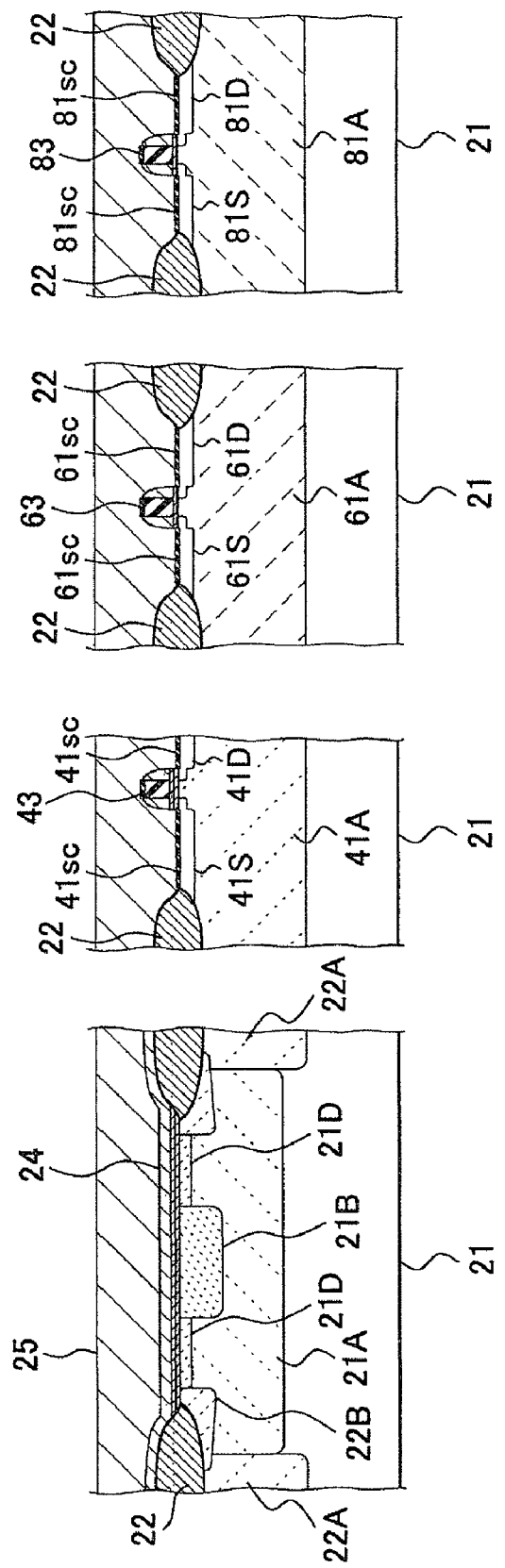
FIG. 8R is a (18th) diagram showing the method of manufacturing a solid state image sensing device according to the second embodiment of the present invention.

Further, in the process of FIG. 8R, the interlayer insulating film 25 is formed on the structure of FIG. 8Q by plasma CVD so as to be, for example, 1500 nm in thickness. Further, the formed interlayer insulating film 25 is flattened by CMP so as to be approximately 1000 nm in film thickness.

Figure 8S:
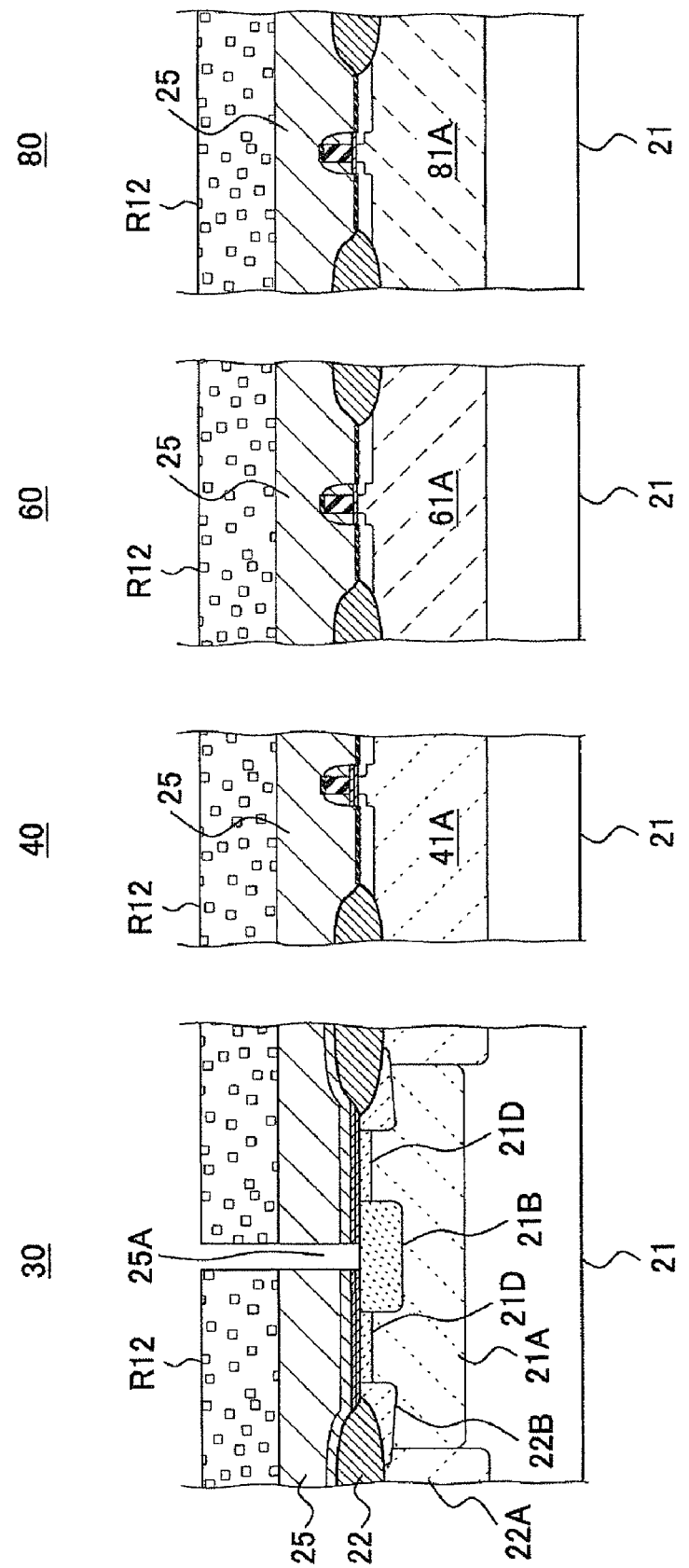
FIG. 8S is a (19th) diagram showing the method of manufacturing a solid state image sensing device according to the second embodiment of the present invention.

Next, in the process of FIG. 8S, a resist pattern R12 that has an opening corresponding to the contact layer 21C in the device region 30 is formed on the interlayer insulating film 25. The interlayer insulating film 25 and the oxide films 24, 23B, and 23A thereunder are successively etched using the resist pattern R12 as a mask, so that is formed a contact hole 25A exposing the surface of the silicon substrate 21 where the intermediate region 21B is formed.

Figure 8T:
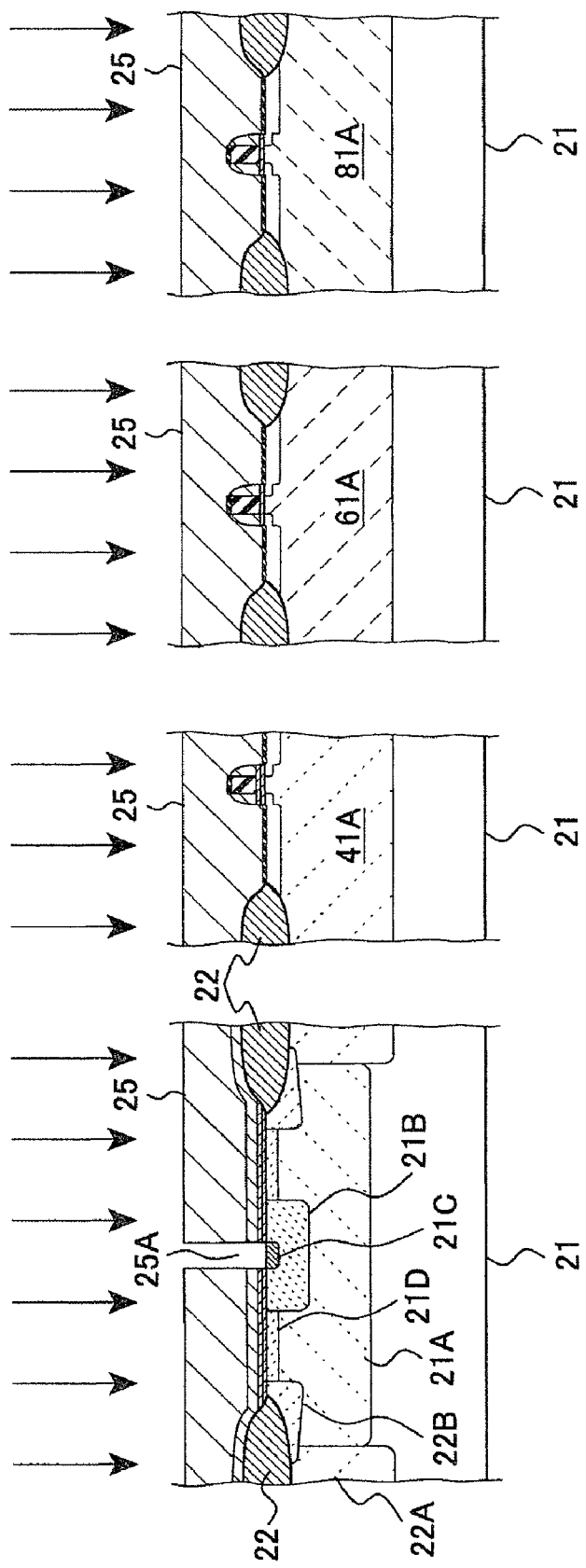
FIG. 8T is a (20th) diagram showing the method of manufacturing a solid state image sensing device according to the second embodiment of the present invention.

Next, in the process of FIG. 8T, the resist pattern R12 is removed, and ion implantation of $P^+$ ions is performed at a dose of $5\times10^{14}$ to $5\times10^{15}$ cm$^{-2}$ at an acceleration voltage of 15 keV or less using the interlayer insulating film 25 as a mask.

Further, for example, by performing heat treatment for 30 seconds at a temperature of 800° C. in a nitrogen atmosphere, the $n^+$ contact layer 21 is formed in the n-type intermediate region 21B.

Further, in the heat treatment processes hitherto including this heat treatment process, the impurity elements implanted in the preceding processes are diffused in the silicon substrate 21, so that the light-receiving region 21A is formed so as to spread to be 1.0 to 1.5 μm deep from the surface of the silicon substrate 21, the intermediate region 21B is formed so as to spread to be 0.2 to 0.7 μm deep from the surface of the silicon substrate 21, and the contact layer 21C is formed so as to spread to be 0.05 to 0.2 μm deep from the surface of the silicon substrate 21. Here, the intermediate region 21B is formed to be deeper than the contact layer 21C, and the light-receiving region 21A is formed to be deeper than the intermediate region 21B.

Further, through the heat treatment processes hitherto, the p-type channel stopper region 22A is formed so as to spread to be 1.2 to 1.7 μm deep from the surface of the silicon substrate 21, and the shield layer 21D is formed so as to spread to be 0.05 to 0.3 μm deep from the surface of the silicon substrate 21. Here, the intermediate region 21B is formed to be deeper than the shield layer 21D. Further, the p-type guard ring 22B is formed at a position deeper than the isolation insulating film 22.

Further, in the process of FIG. 8U, a resist pattern R13 is formed on the structure of FIG. x8T so as to have a resist opening corresponding to the source region 41S in the device region 40, to have resist openings corresponding to the source and drain regions 61S and 61D in the device region 60, and to have resist openings corresponding to the source and drain regions 81S and 81D in the device region 80. Further, the interlayer insulating film 25 is etched using the resist pattern R13 as a mask, so that in the interlayer insulating film 25, a contact hole 45a that exposes the source region 41S is formed in the device region 40, contact holes 65a and 65b that expose the source and drain regions 61S and 61D, respectively, are formed in the device region 60, and contact holes 85a and 85b that expose the source and drain regions 81S and 81D, respectively, are formed in the device region 80.

Figure 8V:
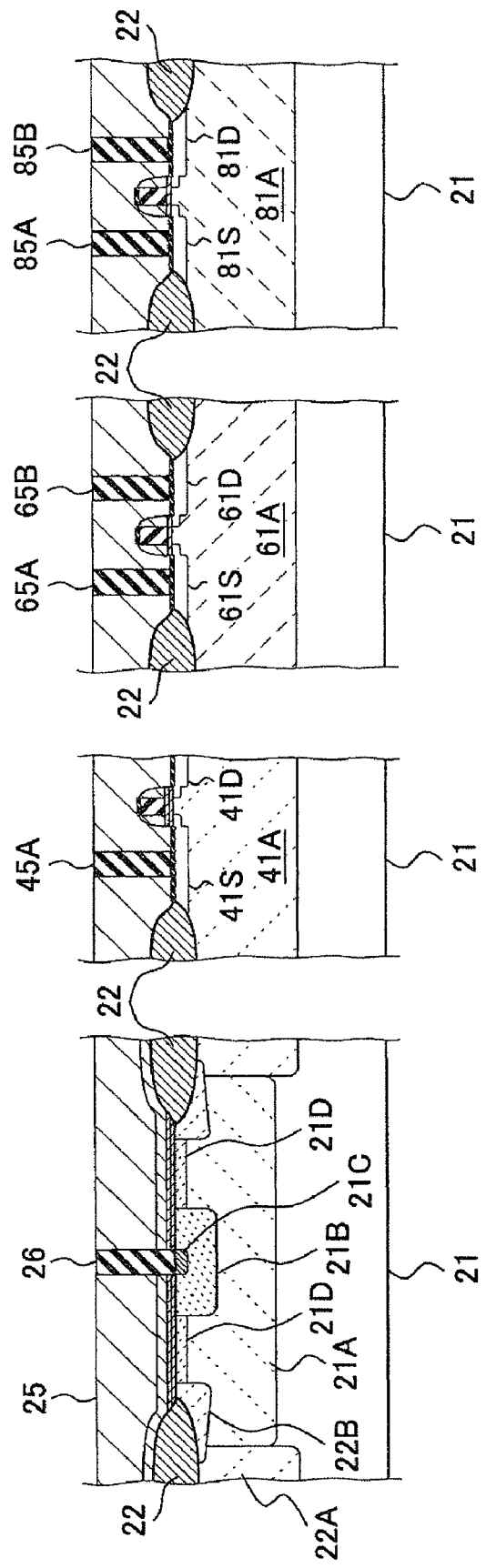
FIG. 8V is a (22nd) diagram showing the method of manufacturing a solid state image sensing device according to the second embodiment of the present invention.

Further, in the process of FIG. 8V, the contact holes 25A, 45a, 65a, 65b, 85a, and 85b are filled with a conductive material such as W, so that the conductive plugs 26, 45A, 65A, 65B, 85A, and 85B are formed.

Thus, according to the present invention, the contact layer 21C is formed in self-alignment with the contact hole 25A in which the conductive plug 26 is formed. Therefore, there is no alignment error between the contact layer 21C and the conductive plug 26, so that it is possible to microfabricate the contact layer 21C as desired in correspondence to the microfabrication of the contact hole 25A. At this point, according to the present invention, it is possible to microfabricate the intermediate layer 21B as long as alignment accuracy with respect to the contact layer 21C is ensured, so that it is possible to minimize the ratio of the intermediate region 21B, which does not contribute to photoelectric conversion, to the light-receiving region 21A.

Even in this case, according to the present invention, since the contact layer 21C containing a large number of defects has its side end part and bottom part continuously covered with the intermediate region 21B, a depletion region formed in the light-receiving region 21A is prevented from reaching the defects in the contact layer 21C, so that leakage current, which is to be dark current, is prevented from being generated.

Further, according to the present invention, the intermediate region 21B is interposed between the highly doped contact layer 21C and the shield layer 21D. Therefore, no high electric field is generated between the contact layer 21C and the shield layer 21D, so that leakage current is also prevented from being generated between the contact layer 21C and the shield layer 21D.

As a result, a solid state image sensing device according to the present invention has excellent sensitivity and photoelectric conversion efficiency.

The above description is given of the case where the light-receiving region 21A has a conduction type of n-type, while the above description is applied directly to the case where the light-receiving region 21A has a conduction type of p-type just by reversing the above-described conduction types.

The present invention is not limited to the specifically disclosed embodiments, and variations and modifications may be made without departing from the scope of the present invention.

According to one aspect of the present invention, by forming the shield layer outside the intermediate region at the surface of the silicon substrate so that the shield layer faces the side end part of the intermediate layer, it is possible to microfabricate the intermediate region in correspondence to the microfabrication of the contact region, so that it is possible to increase the volume of the light-receiving region. This improves the photoelectric conversion efficiency of the photodiode. At this point, according to one aspect of the present invention, the contact region is formed in self-alignment with a contact hole in an insulating film formed on the silicon substrate. Therefore, it is possible to microfabricate the contact region as desired while aligning the contact region with an electrode formed in the contact hole. Further, according to the present invention, the contact region containing defects at high density is enveloped by the intermediate region. Therefore, even when a depletion region extends from the pn junction, the depletion region is prevented from entering the contact region, so that generation of leakage current is effectively prevented.

According one embodiment of the present invention, there is provided a method of manufacturing a solid state image sensing device onto a silicon substrate, including the steps of:

forming a diffusion region of a first conduction type as a light-receiving region in a first device region defined in the silicon substrate;

forming a diffusion region of a second conduction type as a shield layer at a surface of the silicon substrate in correspondence to the light-receiving region;

forming a diffusion region of the first conduction type as an intermediate region over a part of the shield layer at the surface of the silicon substrate in correspondence to the light-receiving region;

forming a semiconductor device in a second device region over the silicon substrate;

forming an interlayer insulating film over the silicon substrate so that the interlayer insulating film covers the semiconductor device;

forming a via hole in the interlayer insulating film in correspondence to a part of the intermediate region;

forming a contact layer of a diffusion region of the first conduction type at the surface of the silicon substrate in the intermediate region by introducing an impurity element of the first conduction type into the silicon substrate through the via hole using the interlayer insulating film as a mask; and forming an electrode in contact with the contact layer by filling the via hole with a conductive material.

What is claimed is:

1. A photodiode formed over a silicon substrate, comprising:
    a light-receiving region formed of a diffusion region of a first conduction type at a surface of the silicon substrate and forming a pn junction with the silicon substrate;
    an intermediate region formed of a diffusion region of the first conduction type at the surface of the silicon substrate so as to be included in the light-receiving region;
    a contact region formed of a diffusion region of the first conduction type at the surface of the silicon substrate so as to be included in the intermediate region;
    a shield layer formed of a diffusion region of a second conduction type in a part of the surface of the silicon substrate outside the intermediate region; and
    an electrode in contact with the contact region,
    wherein the shield layer faces a side end part of the diffusion region forming the intermediate region,
    the intermediate region is in contact with the surface of the silicon substrate between the contact region and the shield layer, and
    the shield layer is formed laterally around the intermediate region and the intermediate region is absent underneath the shield layer.

2. The photodiode as claimed in claim 1, wherein the shield layer is joined to the side end part.

3. The photodiode as claimed in claim 1, wherein the intermediate region has an impurity density higher than an impurity density of the light-receiving region, and the contact region has an impurity density higher than the impurity density of the intermediate region.

4. The photodiode as claimed in claim 1, wherein the light-receiving region forms the pn junction at a lower surface thereof and with the shield layer.

5. The photodiode as claimed in claim 1, further comprising:
    an insulating film formed over the silicon substrate,
    wherein a contact hole in alignment with the contact region is formed in the insulating film, and the electrode is formed of a conductive plug in contact with the contact region through the contact hole.

6. The photodiode as claimed in claim 1, wherein the light-receiving region is in contact with a channel stopper formed around the light-receiving region.

7. A solid state image sensor including a photodiode formed over a silicon substrate, wherein:
    the photodiode includes
        a light-receiving region formed of a diffusion region of a first conduction type at a surface of the silicon substrate and forming a pn junction with the silicon substrate;
        an intermediate region formed of a diffusion region of the first conduction type at the surface of the silicon substrate so as to be included in the light-receiving region;
        a contact region formed of a diffusion region of the first conduction type at the surface of the silicon substrate so as to be included in the intermediate region;
        a shield layer formed of a diffusion region of a second conduction type in a part of the surface of the silicon substrate outside the intermediate region; and
        an electrode in contact with the contact region,
    the shield layer faces a side end part of the diffusion region forming the intermediate region,
    the intermediate region is in contact with the surface of the silicon substrate between the contact region and the shield layer,
    the shield layer is formed laterally around the intermediate region and the intermediate region is absent underneath the shield layer, and
    a CMOS circuit is integrated onto the silicon substrate.

8. The solid state image sensor as claimed in claim 7, wherein the light-receiving region is in contact with a channel stopper formed around the light-receiving region.

9. A method of manufacturing a photodiode onto a silicon substrate, comprising the steps of:
    forming a diffusion region of a first conduction type as a light-receiving region in a first device region defined in the silicon substrate;
    forming a diffusion region of a second conduction type as a shield layer at a surface of the silicon substrate in correspondence to the light-receiving region;
    forming a diffusion region of the first conduction type as an intermediate region over a part of the shield layer at the surface of the silicon substrate in correspondence to the light-receiving region;
    forming an interlayer insulating film over the silicon substrate;
    forming a via hole in the interlayer insulating film in correspondence to a part of the intermediate region;
    forming a contact layer of a diffusion region of the first conduction type at the surface of the silicon substrate in the intermediate region by introducing an impurity element of the first conduction type into the silicon substrate through the via hole using the interlayer insulating film as a mask; and
    forming an electrode in contact with the contact layer by filling the via hole with a conductive material.

* * * * *